United States Patent
King et al.

(10) Patent No.: US 11,131,640 B2
(45) Date of Patent: Sep. 28, 2021

(54) METHODS USING ADVANCED NMR ANALYSIS FOR CORE SAMPLES

(71) Applicant: ExxonMobil Upstream Research Company, Spring, TX (US)

(72) Inventors: Hubert E. King, Flemington, NJ (US);
Pavel Kortunov, Flemington, NJ (US);
Harry W. Deckman, Clinton, NJ (US);
Shreerang S. Chhatre, The Woodlands, TX (US); Hemantkumar R. Sahoo, Spring, TX (US); Antonio S. Buono, Spring, TX (US)

( * ) Notice: Subject to any disclaimer, the term of this patent is extended or adjusted under 35 U.S.C. 154(b) by 7 days.

(21) Appl. No.: 16/823,978

(22) Filed: Mar. 19, 2020

(65) Prior Publication Data
US 2020/0363354 A1 Nov. 19, 2020

Related U.S. Application Data

(60) Provisional application No. 62/847,001, filed on May 13, 2019, provisional application No. 62/847,012, (Continued)

(51) Int. Cl.
*G01N 24/08* (2006.01)
*G01V 3/14* (2006.01)
(Continued)

(52) U.S. Cl.
CPC ........... *G01N 24/081* (2013.01); *G01R 33/44* (2013.01); *G01V 3/14* (2013.01); *G01V 3/38* (2013.01); *G01R 33/34092* (2013.01)

(58) Field of Classification Search
CPC .......... G01N 24/081; G01V 3/14; G01V 3/38; G01V 3/32; G01R 33/34092; G01R 33/44; G01R 33/448; Y02A 90/30
See application file for complete search history.

(56) References Cited

U.S. PATENT DOCUMENTS

| 2018/0306940 A1 | 10/2018 | Basler-Reeder et al. |
| 2019/0064378 A1 | 2/2019 | Liu et al. |
| 2020/0231858 A1* | 7/2020 | Arshad ............... C09K 8/03 |

FOREIGN PATENT DOCUMENTS

CN  106990131 B  *  8/2019  ........... G01N 24/081

OTHER PUBLICATIONS

Chen et al.; Evaluation of light hydrocarbon composition, pore size, and tortuosity in organic rich chalks using NMR core analysis and logging; Jun. 2019; SPWLA 60th Annual Logging Symposium; pp. 1-21.*

(Continued)

*Primary Examiner* — Jay Patidar
(74) *Attorney, Agent, or Firm* — Leandro Arechederra, III

(57) ABSTRACT

A method for determining a core sample property selected from the group consisting of a recoverable oil volume, an irreducible hydrocarbon volume, a recoverable water volume, an irreducible water volume, and any combination thereof can include: determining a porosity of a core sample, wherein the core sample has a permeability of 100 milli-Darcy (mD) or less; saturating the core sample with a NMR saturation fluid; taking a first nuclear magnetic resonance (NMR) measurement of fluids in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluids in the core sample after hydraulic exchange; and deriving the property of the core sample based on the porosity, a NMR signal to fluid volume calibration, and a comparison between the first and second NMR measurements.

20 Claims, 6 Drawing Sheets

Related U.S. Application Data filed on May 13, 2019, provisional application No. 62/847,003, filed on May 13, 2019, provisional application No. 62/847,000, filed on May 13, 2019, provisional application No. 62/847,008, filed on May 13, 2019, provisional application No. 62/847,014, filed on May 13, 2019.

(51) Int. Cl.
*G01V 3/38* (2006.01)
*G01R 33/44* (2006.01)
*G01R 33/34* (2006.01)

(56) References Cited

OTHER PUBLICATIONS

Hirasaki, G. J., et al. (2003) "NMR properties of petroleum reservoir fluids", Magnetic Resonance Imaging, vol. 21, No. 3, pp. 269-277.
Kausik, R., et al. (2016) "NMR Relaxometry in Shale and Implications for Logging", Petrophysics, vol. 57, No. 4, pp. 339-350.
King, H., et al. (2018) "Microstructural Investigation of Stress-Dependent Permeability in Tight-Oil Rocks[1]", Petrophysics, vol. 59, No. 1, pp. 35-43.

* cited by examiner

METHODS USING ADVANCED NMR ANALYSIS FOR CORE SAMPLES

CROSS REFERENCE TO RELATED APPLICATIONS

This application claims priority to U.S. Provisional Application Nos. 62/847,000, 62/847,001, 62/847,003, 62/847,008, 62/847,012, and 62/847,014 all filed May 13, 2019, the disclosures of which are incorporated herein by reference in its entirety.

BACKGROUND

The present disclosure relates to nuclear magnetic resonance (NMR) analysis of core samples.

During oil and gas exploration, zones with higher concentrations of oil and gas can be identified as target zones. One method of identifying target zones is using NMR analysis with core samples and/or logging techniques. NMR logging has shown promise in some formations. However, the NMR signals from water overlap with the NMR signals from oil in small pores. Therefore, NMR logging in tight shale (and similar formations that comprise a substantial amount of small pores) has been unreliable, to date, for identifying target zones.

Additionally, in many formations, the oil and gas is typically readily produced from target zones. However, in tight shale formations, the pore network may not be conducive to production. That is, a target zone may be identified and the formation stimulated for enhanced oil recovery. Initially, the production is quite quick after stimulation but can decline rapidly because the oil and gas located in smaller pores is more difficult to extract. Identifying properties that relate to potential oil recovery (e.g., pore connectivity) for target zones in tight shale would be highly beneficial to the industry.

SUMMARY OF THE INVENTION

The present disclosure relates to nuclear magnetic resonance (NMR) analysis of core samples. More specifically, the NMR analyses described herein relate to determining properties of core samples having a permeability of 100 milliDarcy (mD) or less. These core samples are from formations like tight shale.

A first nonlimiting example embodiment of the present disclosure is a method comprising: saturating a core sample with a NMR saturation fluid, wherein the core sample has a permeability of 100 mD or less, to achieve a saturated core sample; taking a NMR measurement of fluids in the saturated core sample; determining a porosity of the core sample based on a correlation between the NMR measurement and a NMR signal to fluid volume calibration.

A second nonlimiting example embodiment of the present disclosure is a method comprising: determining a porosity of a core sample, wherein the core sample has a permeability of 100 mD or less; saturating the core sample with a NMR saturation fluid to achieve a saturated core sample; taking a NMR measurement of fluids in the saturated core sample; and deriving a volume for a pore type based on the porosity based on a correlation between the NMR measurement and a NMR signal to fluid volume calibration, wherein the pore type is selected from the group consisting of a nanopore, a micropore, a macropore, and any combination thereof. Optionally, determining the porosity of the core sample can be via the first nonlimiting example embodiment.

A third nonlimiting example embodiment of the present disclosure is a method comprising: determining a porosity of a core sample, wherein the core sample has a permeability of 100 mD or less; saturating the core sample with a NMR measurement saturation fluid to achieve a saturated core sample; taking a first NMR measurement of fluids in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluids in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. Optionally, determining the porosity of the core sample can be via the first nonlimiting example embodiment.

A fourth nonlimiting example embodiment of the present disclosure is a method comprising: determining a porosity of a core sample, wherein the core sample has a permeability of 100 mD or less; saturating the core sample with a NMR saturation fluid; taking a first NMR measurement of fluids in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluids in the core sample after hydraulic exchange; and deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid. Optionally, determining the porosity of the core sample can be via the first nonlimiting example embodiment.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Figure 1:
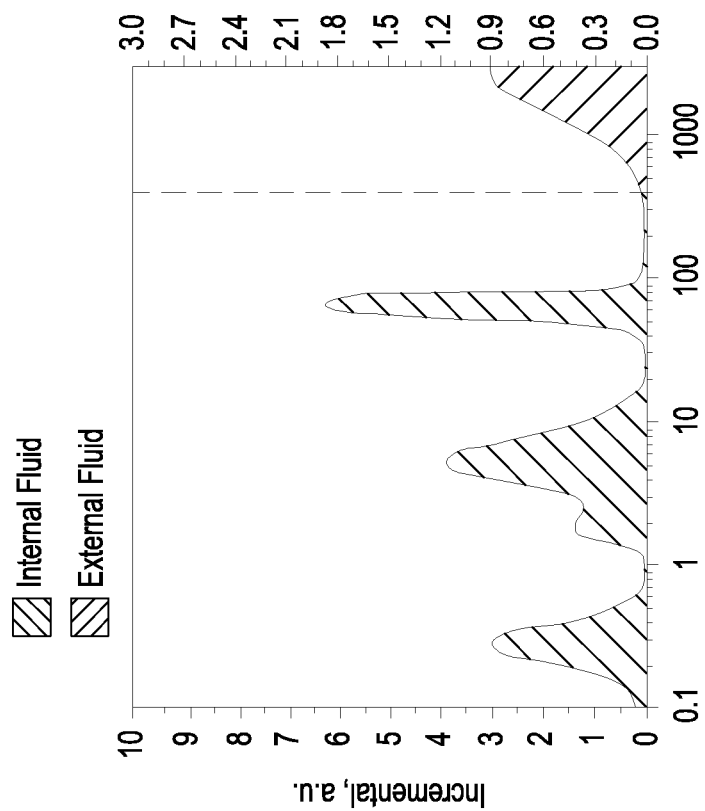
FIGS. 1 and 2 are prophetic, nonlimiting examples of $T_2$ spectra useful in determining a porosity of a core sample.

The present disclosure relates to NMR analysis of core samples. More specifically, the NMR analyses described herein relate to determining properties of core samples from ultra-low permeability formations having a permeability of 100 mD or less, 10 mD or less, alternatively 1 mD or less, or alternatively 10 microDarcy or less. Examples of ultra-low permeability formations are shales, carbonates, tight shale, mudstones, and formations with mixtures thereof.

Definitions

As used herein, the term "ultra-low permeability" when referring to a formation or core sample indicates that it has as permeability 10 mD or less (e.g., 1 mD or less or 10 microDarcy or less).

As used herein, the term "fluid" refers to a combination of liquid and gases.

As used herein, the term "hydrocarbon" refers to organic compounds composed predominantly of hydrogen and carbon. Hydrocarbons include, but are not limited to, alkanes (e.g., methane, ethane, propane, paraffins), cycloalkanes, aromatic hydrocarbons, asphaltenes, nitrogen-containing aromatics, oxygen-containing aromatics, and sulfur-containing aromatics, and mixtures thereof.

As used herein, the term "oil" refers to liquid hydrocarbons at ambient conditions. As used herein, the term "ambient conditions" refers to 20° C. temperature and 101.3 kPa pressure.

As used herein, the term "gaseous hydrocarbons" refers to hydrocarbons that are gaseous at ambient conditions (e.g. methane, ethane, propane, paraffins, and the like).

As used herein, the term "gases" refers to molecules that are gaseous at ambient conditions (e.g. methane, ethane, propane, paraffins, He, Ar, $CO_2$).

As used herein, the term "water" is used generally to describe an aqueous fluid and can include fresh water, salt water, brine, brackish water, and the like. Examples of salts that may be present include, but are not limited to, inorganic salts (e.g., chlorides, sulfates, and carbonates) of Group I and II elements and organic salts (e.g., citrates, acetates, formates, and lactates) of Group I and II elements each along with associated cations (e.g., lithium, sodium, potassium, magnesium, calcium, aluminum, and iron).

As used herein, the terms "bulk volume percent" and "BV %" is volume of fluid per volume of core sample expressed in a percentage. As used herein, the terms "pore volume percent" and "PV %" is volume of fluid per volume of the fluid in core sample expressed in a percentage.

As used herein, the term "porosity" refers to the extent to which a sample is composed of spaces or voids, which may be filled with fluids. Porosity can, for example, have the units of BV %.

As used herein, the terms "nanopore," "micropore," and "macropore" do not necessarily indicate an absolute size for a pore but rather are relative terms that relate to the confinement of fluids within a pore where nanopores are the most confining pore and the smallest of the pore types, micropores are less confining than nanopores and the medium size of the pore types, and macropores are the least confining pore and the largest of the pore types. As described below, NMR measurements (e.g., $T_2$ relaxation times, $T_1/T_2$ ratios, diffusion NMR, and NMR imaging) are used to define each of these terms instead of the more common IUPAC definitions.

As used herein, the term "nanopore oil volume" refers to the volume of oil in nanopores. As used herein, the term "nanopore water volume" refers to the volume of water in nanopores. Nanopore oil volume and nanopore water volume can, for example, have units of BV % or PV %.

As used herein, the term "micropore oil volume" refers to the volume of oil in micropores. As used herein, the term "micropore water volume" refers to the volume of water in micropores. Micropore oil volume and micropore water volume can, for example, have units of BV % or PV %.

As used herein, the term "macropore oil volume" refers to the volume of oil in macropores. As used herein, the term "macropore water volume" refers to the volume of water in macropores. Macropore oil volume and macropore water volume can, for example, have units of BV % or of $cm^3$ of fluid per $cm^3$ of total fluid in the core sample.

As used herein, the term "recoverable oil volume" refers to the volume of oil in a core sample that can be displaced in a hydraulic exchange. Recoverable oil volume depletion has units of BV % or PV %. Preferably, the hydraulic exchange is performed with a fluid that is not miscible with the oil such as water.

As used herein, the term "recoverable water volume" refers to the volume of water in a core sample that can be displaced in a hydraulic exchange. Recoverable water volume has units of BV % or PV %.

As used herein, the term "immobile fluid volume" refers to the volume of fluid that cannot be hydraulically exchanged. Immobile fluid volume has units of BV % or PV %.

As used herein, the term "irreducible hydrocarbon volume" refers to a volume of hydrocarbon (e.g., gas or oil) that is remaining after the sample is hydraulically exchanged with a liquid fluid that is immiscible with hydrocarbons. Nonlimiting examples of such a fluid is water. Irreducible hydrocarbon volume can, for example, have units of BV % or PV %.

As used herein, the term "irreducible water volume" refers to a volume of water that is remaining after the sample is hydraulically exchanged with hydrocarbon (e.g., oil or gaseous hydrocarbons, or mixtures thereof). Irreducible water volume can, for example, have units of BV % or PV %.

As used herein, the term "NMR measurement" refers to detection of hydrogen atoms ($^1$H), carbon atoms ($^{13}$C), fluorine atoms ($^{19}$F), sodium atoms ($^{23}$Na), or other atoms with non-zero magnetic moment using a low-field, intermediate-field, or high-field NMR and performing spectroscopy measurements, relaxometry measurements, diffusion measurements, imaging measurements, or combinations thereof. As used herein, the term "low-field NMR" refers to a nuclear magnetic resonance instrument operating at magnetic field from $25\times10^{-6}$ Tesla up to 0.6 Tesla. As used herein, the term "intermediate-field NMR" refers to a nuclear magnetic resonance instrument operating at magnetic field from 0.6 Tesla up to 1.4 Tesla. As used herein, the term "high-field NMR" refers to a nuclear magnetic resonance instrument operating at magnetic field from 1.4 Tesla up to 70 Tesla.

As used herein, the terms "measurement," "measured data," and grammatical variations thereof refer to acquired and processed data.

As used herein, the terms "Carr-Purcell-Meiboon-Gill" or "CPMG" refers to a spin-echo pulse sequence consisting of the steps: (1) a 90° pulse that creates a transverse magnetization, (2) a spin-echo period (delay-180°-delay block) that determines the decay of the magnetization, which can repeated any number times, and (3) acquisition of the $T_2$ relaxation times.

As used herein, the term "NMR applicable exchange fluid" or "NMR exchange fluid" relative to core samples refers to a fluid that when exchanged with an existing fluid in the core sample provides a different NMR signal (e.g., chemical shift) and/or different NMR signal intensity. For example, deuterated water is a NMR applicable exchange fluid for water because the $^1H$ NMR signals reduce when deuterated water replaces the water in the core sample. In another example, fluorinated hydrocarbons are NMR applicable exchange fluids for hydrocarbons because the $^{19}F$ NMR signal increases when the fluorinated hydrocarbons replace hydrocarbons and the $^1H$ NMR signals decrease when the fluorinated hydrocarbons (preferably perfluorocarbons) replace hydrocarbons. Therefore, fluorocarbons are $^1H$ NMR applicable exchange fluid and $^{19}F$ NMR applicable exchange fluid. As used herein, the term "NMR applicable exchange fluid" can be modified by a specific isotope to indicate which NMR type of NMR the NMR applicable exchange fluid relates. For example, a $^1H$ NMR applicable exchange fluid refers to exchange fluid suitable for use in $^1H$ NMR measurements. If a specific type of NMR is not specified, the term NMR applicable exchange fluid applies to fluids suitable for use in any type of NMR.

As used herein, the term "NMR saturation fluid" relative to core samples refers to a NMR visible fluid that is used to fill, to the extent it is able, the pores of the core sample. Exchange of fluids in the core sample with a NMR saturation fluid may or may not occur during saturation.

As used herein, the term "deuterated hydrocarbon" refers to a hydrocarbon where any number of hydrogens (one to all) has been replaced with deuterium.

As used herein, the term "$^{13}C$-enriched hydrocarbon" refers to a hydrocarbon where any number of carbons (one to all) has been replaced with $^{13}C$ carbon.

As used herein, the term "fluorinated hydrocarbon" refers to a hydrocarbon where any number of hydrogens (one to all) has been replaced with fluorine. As used herein, the term "perfluorinated hydrocarbon" refers to a hydrocarbon where all hydrogens have been replaced with fluorine.

As used herein, the term "chlorinated hydrocarbon" refers to a hydrocarbon where any number of hydrogens (one to all) has been replaced with chlorine. As used herein, the term "perchlorinated hydrocarbon" refers to a hydrocarbon where all hydrogens have been replaced with chlorine.

To facilitate a better understanding of the embodiments of the present invention, the examples of preferred or representative embodiments are given throughout the various sections below. In no way should the following examples be read to limit, or to define, the scope of the invention.

Core Samples

Core samples can be extracted from subterranean formations by known methods. Once collected downhole, the core samples can be handled a variety of ways, and the methods of handling can impact the methods described herein.

Core samples are typically cylindrical sections of a formation extracted by drilling radially from the wellbore into a sidewall of a wellbore. These core samples are often referred to as horizontal core samples or sidewall core samples. However, vertical core samples that are cylindrical sections extracted along the length of the wellbore can also be used in the methods described herein. The methods and analyses described herein are not limited by the extraction methods and direction of the core samples.

In a first example, the core samples can be preserved at formation pressure and temperature. In such cases, NMR analyses for porosity can be performed directly on the as-received, preserved core sample. Once initial NMR measurements are performed, the temperature and pressure conditions of the core samples can be changed. The amount and composition of the gas and liquid that elute from the preserved core sample can be measured. Then, these measurements can be used when deriving other core sample or formation properties (described further herein).

In another example, the core samples can be extracted from the formation and allowed to come to ambient temperature and/or pressure as the coring tool ascends from the collection location to the top of the borehole. In some instances, the amount and composition of the gas and liquid that elute from the core sample can be measured (e.g., during ascension or collected during ascension and measured later). Then, these measurements can be used when deriving other core sample or formation properties.

In another example, core samples can be extracted from the formation and allowed to come to ambient temperature and/or pressure as the coring tool ascends from the collection location to the top of the borehole where only a portion of or none of the gas and liquid that elute from the core sample is preserved. In these instances, some measurements may optionally be taken during production to provide a more complete estimation of the other core sample or formation properties. When the core sample is not preserved it is still possible to derive all of the information about all of the fluid properties described herein (e.g., recoverable oil volume, recoverable water volume, porosity, and the like).

NMR Measurement Methods

In the methods of the present invention, one or more NMR methods can be implemented. NMR measurement methods can include the steps of sending one or more radiofrequency (RF) pulses and detecting NMR signals from fluids inside and outside of the core sample. The NMR signals can correspond to, for example, a free induction signal ($T_2$*), a spin echo signal ($T_2$), a stimulated echo signal, a train of spin or stimulated echo signals ($T_2$), a thermal equilibrium signal ($T_1$), and any combination thereof. Various NMR measurement methods can be utilized include, but are not limited to, spectroscopy, diffusometry, 1-dimensional imaging, 2-dimensional imaging, 3-dimensional imaging, and any combination thereof. Further, two or more of the NMR signals can be correlated in a multi-dimensional plot (e.g., a spectroscopically resolved $T_2$, diffusion or imaging plots, or a $T_1$-$T_2$ 2-dimensional correlation map).

The free induction decay (FID) describes magnetic field heterogeneity created by non-ideality of applied external magnetic field, internal magnetic field gradients caused by differences of magnetic susceptibilities of fluids and minerals in the core sample and local magnetic fields derived by surrounded atoms.

NMR spectroscopy determines differences in resonance frequencies caused by local chemical environments (e.g., $^1H$—O versus $^1H$—C). NMR spectroscopy quantitatively defines signals from different chemicals and fluids such as water ($^1H$—O—$^1H$) and hydrocarbons ($^1H$—C— and $^1H$=C—).

The relaxation time $T_2^*$ describes the time constant for the loss of phase coherence of the transverse magnetization after the radiofrequency (RF) excitation field is turned off. This time dependent loss of phase coherence may be referred to as the free induction decay.

The time constant $T_2$ describes the characteristic decay time for the loss of phase coherence of the transverse magnetization following an application of two (or more) RF pulses. If two RF pulses are applied which are separated in time by $\tau$, a NMR nuclear spin echo is formed at time $2\tau$. The time dependence of the amplitude of the echo is described by $T_2$ relaxation mechanism. In this mode of measurement, the pair of RF pulses is repeated by successively increasing the delay time $\tau$, between the first and second RF pulse. In an alternative embodiment of this method, known as the CPMG pulse sequence, a long series of RF "refocusing" pulses are applied every $2\tau$, time intervals following the first pulse. This generates a spin echo following every time period $\tau$, following the second pulse.

The relaxation time $T_1$ is the characteristic time for the longitudinal magnetization to return to thermal equilibrium. There are different experimental approaches for measuring the $T_1$ value. One common method is the so-called inversion recovery method in which a sufficiently strong RF pulse is appropriately applied to either squelch or actually invert the magnetization. The return to thermal equilibrium is then monitored by sampling the state of the magnetization over time either by a series of free induction measurements or spin echo measurements.

The diffusometery NMR measurement methods use a pulse sequence to spatially encode and decode the magnetization of molecules. Typically, a Hahn-echo or stimulated-echo pulse sequence is used. Measurements provide the distribution of spin displacements over the observation period of time to calculate the distribution of self-diffusion coefficient(s) of molecule(s) including those inside the core sample (with slower self-diffusion) and outside of core sample (with faster self-diffusion).

The imaging NMR measurement methods determine the spatial distribution of spin densities inside and outside of core sample. NMR imaging determines the heterogeneity of the fluid inside the core sample as well as presence of NMR visible fluid (e.g., water, oil) outside of the core sample.

Generally, the nuclei of unique substances will generate unique responses (e.g. relaxation times). Hence, one excitation pulse may permit measurement of multiple substances in a particular volume. For example, water displays a different response than oil, allowing differentiation between the two depending on the proton or nuclei's response to the excitation pulse. Also, substances having different physical states will respond differently. For example, ice responds to an excitation pulse differently from water because of the structured nature of ice crystals. More particularly, in this example, the magnetic moment of hydrogen nuclei in ice and snow returns to its equilibrium state so quickly that it becomes undetectable or "invisible" to standard NMR equipment.

A NMR signal to fluid volume calibration correlates a measured NMR signal to a volume. Such a calibration can be obtained by a variety of methods. In a first example, the fluid of interest for the calibration can be diluted at various concentrations in a host fluid. The fluid of interest and the host fluid should be readily distinguishable by NMR. For example, diluting 1 mL of water in 19 mL of deuterated water and measuring the NMR signal from the entire 20 mL provides a NMR signal corresponding to 1 mL of water in a 20 mL volume or 5 BV %. A series of such dilutions can be done to create the NMR signal to fluid volume calibration. Then, when measuring NMR signals of fluids in a core sample by the same NMR measurement method and under the same conditions (e.g., magnetic strength, pulse sequence, temperature, and the like), the volume of the sample that the NMR signal measures and the NMR signal intensity can be correlated to a volume of fluid based on the NMR signal to fluid volume calibration.

In another example, a vial with 1 mL of water surrounded by 19 mL of deuterated water can be used to correlate provides the NMR signal corresponding to 1 mL of water in a 20 mL volume or 5 BV %. A series of such experiments can be done to create the NMR signal to fluid volume calibration. Then, when measuring NMR signals of fluids in a core sample, the volume of the sample that the NMR signal measures and the NMR signal intensity can be correlated to a volume of fluid based on the NMR signal to fluid volume calibration. It should be noted that the first method with direct dilution in the fluid of interest in the host fluid is preferred and provides a more accurate NMR signal to fluid volume calibration.

In any method of determining a NMR signal to fluid volume calibration, the density of the nuclei the NMR probes should be taken into consideration. Further, in any method of determining a NMR signal to fluid volume calibration, the concentration of nuclei (e.g., $^1H$) in samples used for determining the NMR signal to fluid volume calibration should be similar to the amount of fluid having $^1H$ in a core sample. For ultra-low permeability formations, the porosity can be 30 BV % or less, and more likely 15 BV % or less. Therefore, control samples should be NMR invisible fluids with varying low concentrations of NMR visible fluids. Then, the NMR signal to fluid volume calibration that correlate NMR signal intensity to fluid amount can be more correctly estimated.

The sum of all fluid volumes gives the total fluid filled volume of the corresponding core sample, which translates to the total fluid filled porosity in BV %. Worth noting is that the 1 mL of brine and 1 mL of ISOPAR™ (a mixture of synthetic isoparaffins, available from ExxonMobil Chemical) have similar hydrogen atom density and, therefore, give comparable NMR signal, which allows for using a similar NMR signal to fluid volume calibrations for both fluids, for example, the NMR signal to fluid volume calibration values may be within about 10% and potentially within 5% depending on the isoparaffin composition. This finding makes total fluid filled porosity measurements very robust and fluid type independent. This is especially important for characterization of unknown fluids with low-field NMR that does not provide a direct fluid type speciation by spectroscopy.

Hydraulic Exchange

Hydraulic exchange is based on exchanging and displacing a fluid in a core sample using a fluid that is immiscible with at least one of the fluids in the core sample. Hydraulic exchange involves introducing an exchange fluid from outside the core sample using pressure or a change in concentration applied to the exchange fluid outside at least one portion of the core sample. The fluid is allowed to flow through the core sample causing fluids in the core sample to be replaced (and/or displaced) with the exchange fluid. Optionally, temperature can be elevated during fluid exchange.

In a preferred embodiment of the hydraulic exchange process, a pressure differential across the core sample is created that causes an exchange fluid to flow into and through the core sample. In this embodiment it is preferred to seal or partially seal faces of the core through which it is not desired to have fluid flow. For example, if the sides wall of a cylindrical core are sealed and fluid is introduced at one end of the cylinder, the pressure differential over the length of the cylinder can be up to 12,000 psig, or 6,000 psig, or 1,000 psig, or 500 psig, or 100 psig These methods of hydraulic fluid exchange are known in the art.

The number of pore volumes of exchange fluid used in hydraulic exchange methods can be one or more pore volumes (e.g., 1 pore volume to hundreds of pore volumes, 1 pore volume to 30 pore volumes or more, or alternatively 3 pore volumes to 6 pore volumes, or alternatively 6 pore volumes to 30 pore volumes). If the pore structure of the core is relatively homogeneous, a relatively sharp displacement front will move through the core and the amount of fluid needed to completely exchange the core can be in a range from 1 to 2 pore volumes. As the heterogeneity of the pore structure increases, the front broadens (becoming "softer") and the amount of fluid needed for hydraulic exchange increases to a range from 1.5 to 10 pores volumes. In some instances the core has very high permeability pathways and the fluid is primarily driven through a small portion of the core such as a permeability streak. In this case the amount of fluid needed for hydraulic exchange can be in a range from 2 to 30 pore volumes. The nature of the front can be assessed by compositionally monitoring fluid that elutes from the core as a function of time of by X-ray radiography or x-ray microtomography as described in King et al. (2018) *Petrophysics* 59 (01), 35-43.

Generally, hydrophilic exchange fluids are used for hydraulic exchange of hydrocarbon fluids in the core sample, and hydrophobic exchange fluids are used for hydraulic exchange of water in the core samples. However, because pressure is used to drive the flow of fluid, some water in the core sample may be replaced with a hydrophilic exchange fluid, especially if the water is in larger pores or cracks that allows for hydraulic fluid flow more readily than in smaller pores. The same may also occur with hydrocarbon fluids and hydrophobic exchange fluids.

Examples of hydrophilic $^1$H NMR applicable exchange fluid can include, but are not limited to, deuterated water (D$_2$O), deuterated alcohols (e.g., deuterated methanol, deuterated ethanol, deuterated isopropanol, deuterated t-butanol, and the like), deuterated glycols (e.g., deuterated ethylene glycol, deuterated propylene glycol, and the like), chlorinated alcohols, chlorinated glycols, fluorinated alcohols, fluorinated glycols, and any combination thereof.

Examples of hydrophobic $^1$H NMR applicable exchange fluid can include, but are not limited to, ISOPAR™, deuterated $C_1$-$C_{20}$ hydrocarbons (e.g., deuterated methane, deuterated ethane, deuterated propane, deuterated butane, deuterated pentane, deuterated hexane, deuterated cyclohexane, deuterated toluene, and the like), chlorinated $C_1$-$C_{20}$ hydrocarbons, fluorinated $C_1$-$C_{20}$ hydrocarbons, and any combination thereof.

Examples of hydrophilic $^{13}$C NMR applicable exchange fluid can include, but are not limited to, alcohols (e.g., methanol, ethanol, isopropanol, t-butanol, and the like), glycols (e.g., ethylene glycol, propylene glycol, and the like), and any combination thereof.

Examples of hydrophobic $^{13}$C NMR applicable exchange fluid can include, but are not limited to, $^{13}$C enriched $C_5$-$C_{20}$ hydrocarbons (e.g., $^{13}$C enriched pentane, $^{13}$C enriched hexane, $^{13}$C enriched cyclohexane, $^{13}$C enriched, and the like), and any combination thereof.

Examples of hydrophilic $^{19}$F NMR applicable exchange fluid can include, but are not limited to, fluorinated alcohols, fluorinated glycols, and any combination thereof.

Examples of hydrophobic $^{19}$F NMR applicable exchange fluid can include, but are not limited to, fluorinated $C_1$-$C_{20}$ hydrocarbons.

Examples of hydrophilic $^{23}$Na H NMR applicable exchange fluid can include, but are not limited to, water comprising sodium salts like NaCl.

Examples of hydrophobic $^{23}$Na NMR applicable exchange fluid can include, but are not limited to, sodium containing ionic liquids.

Each of the foregoing exchange fluid examples may be partially deuterated or completely deuterated, partially chlorinated or perchlorinated, or partially fluorinated or perfluorinated, as applicable to the chemical composition. Preferably, the exchange fluid examples are completely deuterated, perchlorinated, or perfluorinated, as applicable to the chemical composition.

Typically, the amount NMR signal correlates to the volume of fluid being analyzed. The exchange fluid can be NMR active and cause an increase to the NMR signal or can be NMR invisible and cause a decrease in NMR signal. The NMR analysis can involve monitoring and analyzing changes to NMR signals over time to derive a variety of core sample attributes (e.g., a porosity, pore type distribution, nanopore oil volume, nanopore water volume, micropore oil volume, micropore water volume, macropore oil volume, macropore water volume, initial oil saturation volume, complete oil saturation volume, initial water saturation volume, complete water saturation volume, recoverable oil volume, recoverable water volume, irreducible hydrocarbon volume, irreducible water volume, and immobile fluid volume, described further herein).

During hydraulic exchange and/or during NMR analysis the core samples, the core samples and corresponding fluid inside and outside of the core samples can be at an elevated temperature. Generally, when the exchange fluid is a liquid, the elevated temperature should be below the boiling point of the fluid at the pressure of the fluid (described below). Suitable temperatures can be ambient up to about 250° C., alternatively 50° to 150° C.

Further, during NMR analysis, the core samples can be exposed to a confining pressure. For example, the samples may be pressurized to approximate downhole conditions. The core samples can be exposed to a confining pressure of up to 7,500 psig, and the fluid can be exposed to a pressure sufficient to create a pore pressure up to 6,000 psig and temperature up to 300° F.

Before and/or after hydraulic exchange, the mass of the core sample with fluid therein can be taken and compared.
Saturation Saturating a core sample with a NMR saturation fluid may be done by any suitable method including, but not limited to, hydraulically pushing the NMR saturation fluid into the core sample.

The core samples are preferably as received core samples that still contain native fluids. Therefore, while the temperature can be elevated when saturating the core sample, preferably ambient temperature is maintained to mitigate native fluid in the core sample from exchanging with the NMR saturation fluid. However, exchange of native fluids in the core sample for the NMR saturation fluid may occur during saturation.

Any NMR saturation fluid can be used. Preferably, the NMR saturation fluid is water or a hydrocarbon based on the fluid that would have otherwise been present downhole. For example, the NMR saturation fluid can be selected based on the type of fluid released from the core sample from when the core sample was collected to when the saturation occurred. In another example, for a core sample from a production well or a core sample from a similar geophysical environment where production composition known, the produced fluid may be used to guide which NMR saturation fluid to use. NMR saturation fluid type should match the type of fluid predominantly present in the fluid presumed to be present downhole. That is a hydrocarbon NMR saturation fluid should be used when hydrocarbons are presumed to be the downhole fluid, and water should be used when water is presumed to be the downhole fluid.

Examples of hydrocarbon NMR saturation fluids include, but are not limited to, ISOPAR™, $C_5$-$C_{40}$ hydrocarbons (e.g., toluene, xylene, heptane, hexatriacontane, and mixtures of linear paraffins), and the like, and combinations thereof.

Examples of hydrophilic NMR saturation fluids include, but are not limited to, water, and the like.

Porosity

Porosity provides an indication of the total amount of fluid in a formation. Further herein is described how to derive compositional details and mobility information about the fluid in the formation.

When the core is preserved the porosity can be measured in the preserved state where the sample is saturated with fluid. In this case the porosity is determined by correlating the NMR signal attributed to the liquid in the core sample to a volume. As discussed above, a NMR signal to fluid volume calibration, calibrated with a known amount of fluid, can be used to quantitatively correlate NMR signal intensity to volume of each fluid phase.

If the sample is not preserved the porosity of a core sample can be determined by saturating the core sample with a NMR saturation fluid. As discussed above, a NMR signal to fluid volume calibration, calibrated with a known amount of fluid, can be used to quantitatively correlate NMR signal intensity to volume of each fluid phase.

Alternatively, porosity on a non-preserved core can be determined without hydraulic exchange if, from an independent means, it is determined that less than 25%, preferably less than 10%, even more preferably less than 5% of the fluid accessible pores are not filled with fluid. For example, the empty pore space can be assessed by measuring NMR signals before and after saturation of cores from a similar geophysical environment.

The NMR signal from the fluid in the core sample (e.g., native fluid and/or the NMR saturation fluid) can be used to estimate the porosity of the core sample.

In one example, a $T_2$ spectrum can be measured. Generally, as described below relative to fluid volume for different pore types, $T_2$ relaxation times above about 300 ms correspond to the fluid surrounding the core sample (or free fluid). The integral of the area under the $T_2$ relaxation curve for relaxation times below 300 ms correlates to the total volume of the fluid via a NMR signal to fluid volume calibration. The NMR saturation fluid should be selected to have a $T_2$ relaxation time when not confined in a core sample of greater than 300 ms or additional correction factors should be applied. Examples of fluids with $T_2$ relaxation times greater than 300 ms when not confined by a core sample include, but are not limited to, ISOPAR™, $C_5$-$C_{40}$ hydrocarbons (e.g., toluene, xylene, heptane, hexatriacontane, and mixtures of linear paraffins), water, and the like, and combinations thereof. Preferably, $C_5$-$C_{40}$ alkanes including mixtures thereof are used as NMR saturation fluids in this method.

Figure 2:
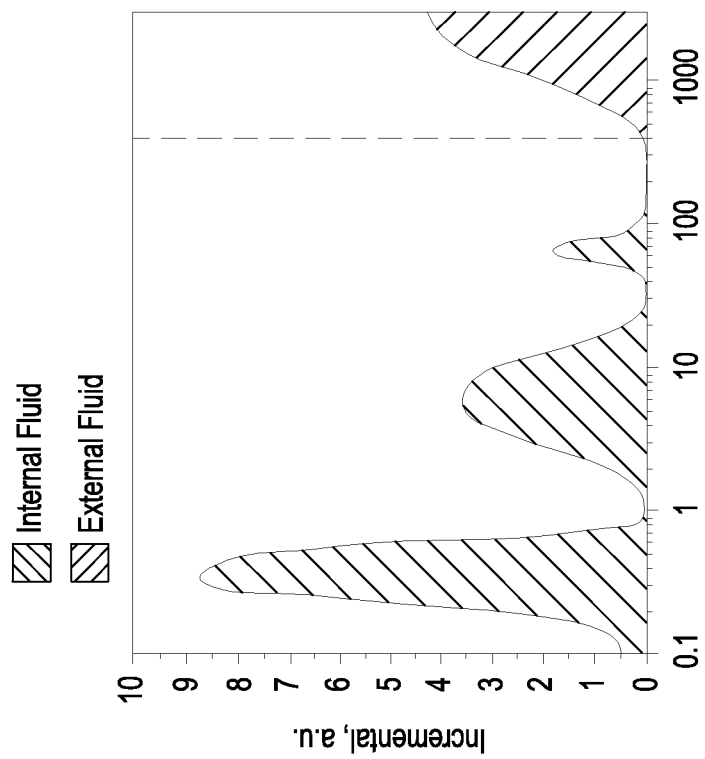

FIGS. 1 and 2 are prophetic, non-limiting examples of $T_2$ spectra useful in determining a porosity of a core sample. In both figures, there are several $T_2$ intensity peaks from 0.1 ms to 300 ms that correspond to NMR signals from toluene inside the core sample. Above 300 ms, the NMR signal is from the fluid external to the core sample. The areas under the $T_2$ spectrum from 0.1 ms to 300 ms correlates (per the NMR signal to fluid volume calibration) to the volume of NMR signal to fluid in the core sample and, consequently, the porosity.

Accordingly, a method of the present disclosure for determining a porosity of a core sample can include saturating a core sample with a NMR saturation fluid, wherein the core sample has a permeability of 100 mD or less, to achieve a saturated core sample; taking a NMR measurement of the saturated core sample; determining a porosity of the core sample based on a correlation between the NMR measurement and a NMR signal to fluid volume calibration, wherein the NMR measurement is $^1$H $T_2$ relaxation times measured with low-field and/or intermediate-field NMR and the correlation is between an area under a $^1$H $T_2$ relaxation time spectrum of the core sample from 0.1 ms to 300 ms and the NMR signal to fluid volume calibration.

In another example using a different NMR measurement, in $T_1$-$T_2$ 2-dimensional correlation map, lower $T_1$ and lower $T_2$ values correspond to fluids confined by in the pore structure of a core sample. For example, measuring the $^1$H $T_1$ and $^1$H $T_2$ relaxation times with low-field and/or intermediate-field NMR, $^1$H $T_1$ of 0.1 ms to 300 ms and $^1$H $T_2$ of 0.1 ms to 300 ms correspond to water and hydrocarbon confined in the pore structure of a core sample. Accordingly, using a NMR signal to fluid volume calibration, the volume of fluid in the core sample can be determined from the area under the $T_1$-$T_2$ 2-dimensional correlation map for $^1$H $T_1$ of 0.1 ms to 300 ms and $^1$H $T_2$ of 0.1 ms to 300 ms. When describing the area under a map herein, it is the integral of the z-axis (e.g., signal intensity) for the provided range(s) of the x- and/or y-axes (e.g., $T_1$ relaxation time and/or $T_2$ relaxation time).

Accordingly, a method of the present disclosure for determining a porosity of a core sample can include saturating a core sample with a NMR saturation fluid, wherein the core sample has a permeability of 100 mD or less, to achieve a saturated core sample; taking a NMR measurement of the saturated core sample; determining a porosity of the core sample based on a correlation between the NMR measurement and a NMR signal to fluid volume calibration, wherein the NMR measurement is $^1$H $T_1$-$T_2$ 2-dimensional correlation map measured with low-field and/or intermediate-field NMR and the correlation is between an area under a $^1$H $T_1$-$T_2$ relaxation time plot of fluid in the core sample from $T_2$ of 0.1 ms to 300 ms and $T_1$ of 0.1 ms to 300 ms and the NMR signal to fluid volume calibration.

In another example method, a low-field NMR can be used in relaxometery mode for collecting $T_2$ relaxation times with a variable refocusing delay time τ, also referred to herein as a NMR signal decay. Then, the total proton content (which relates to the total fluid present as described above) is obtained by extrapolating the relaxation time to zero time. For ultra-low permeability core samples, the fluid in the smaller pores is more clearly resolved with shorter refocusing delay time τ below 200 μs, preferentially below 50 μs.

In another example using a different NMR measurement, a low-field NMR can be used in relaxometery mode for collecting $T_2$ relaxation times with a variable refocusing delay time τ, also referred to herein as a NMR signal decay. Then, the total proton content (which relates to the total fluid present as described above) is obtained by extrapolating (e.g., c) the relaxation time to zero refocusing delay. The NMR signal intensity can be converted to fluid volume based on NMR signal to fluid volume calibration to yield a plot of fluid volume as a function of refocusing delay τ. Then, the area under the fit corresponds to the porosity. For ultra-low permeability core samples, the fluid in the smaller pores is more clearly resolved with shorter refocusing delay time τ below 200 μs, preferentially below 50 μs.

Figure 3:
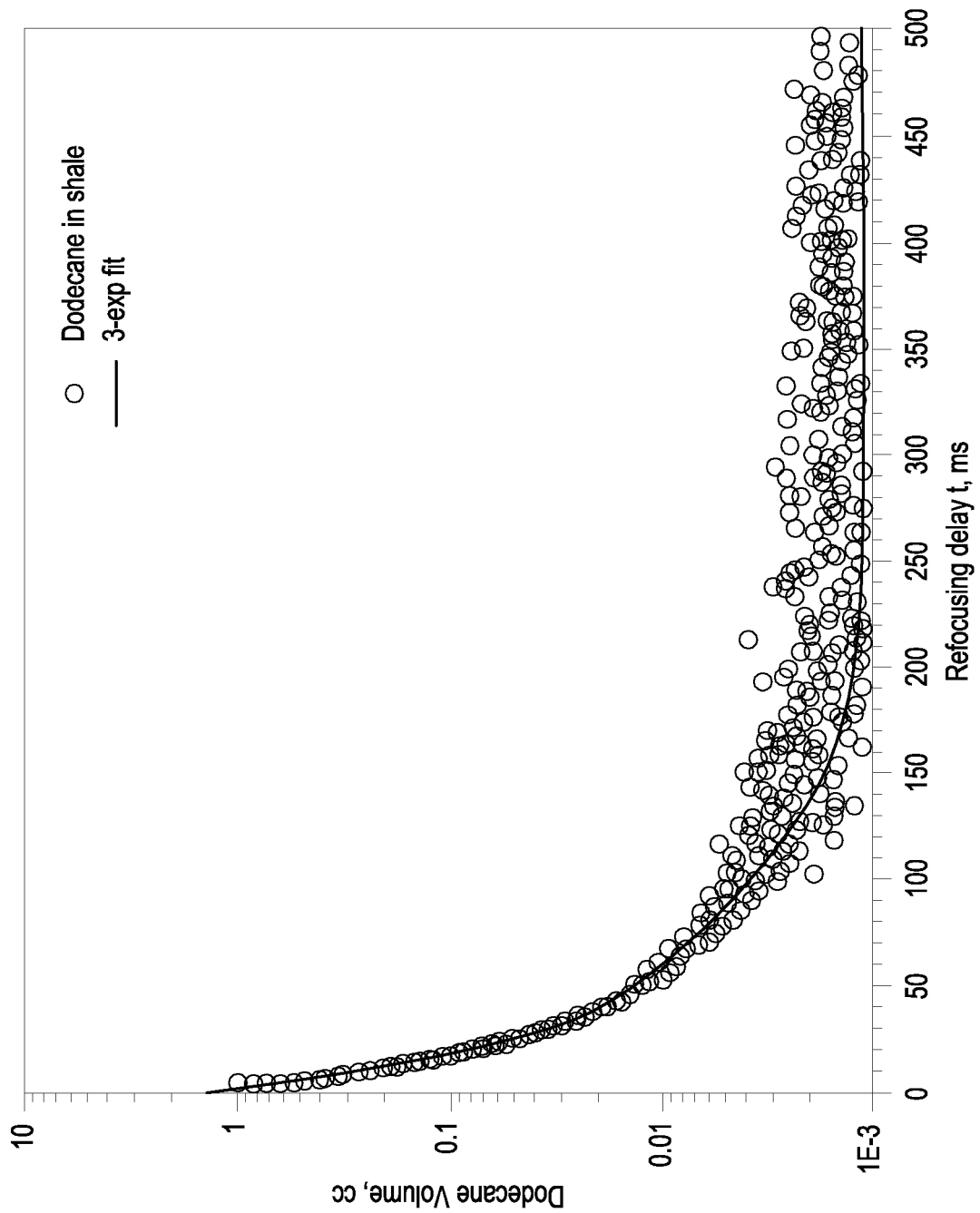
FIG. 3 is a plot of the refocusing delay $\tau$ data after the NMR signal intensity was correlated to volume of dodecane.

Example 1. The fluid in a core sample was hydraulically exchanged for dodecane. Then, the low-field NMR measurements (CPMG, 2 MHz, 25° C.) of the fluid in the core sample were taken. FIG. 3 is a plot of the NMR signal from the sample as a function of refocusing delay τ. NMR signal intensity was correlated to a known volume of dodecane. The extrapolation of the data to zero time corresponds to the volume of dodecane in the core sample and, consequently, the porosity. In this example, the dodecane volume was 1.2 mL, which is 9.3 BV %.

Accordingly, a method of the present disclosure for determining a porosity of a core sample can include saturating a core sample with a NMR saturation fluid, wherein the core sample has a permeability of 100 mD or less, to achieve a saturated core sample; taking a NMR measurement of the saturated core sample; determining a porosity of the core sample based on a correlation between the NMR measurement and a NMR signal to fluid volume calibration, wherein the NMR measurement is $T_2$ NMR signal intensity as a function of refocusing delay and the correlation is between a y-value at a y-intercept of an extrapolation of the $T_2$ NMR signal intensity including x=0 and the NMR signal to fluid volume calibration.

In yet another example method, a high-field $^1$H NMR or $^{13}$C NMR can be used where the chemical shift reflects the type of fluid (e.g., hydrocarbon and water for $^1$H NMR or hydrocarbon for $^{13}$C NMR). Then, the area under the signal for specified chemical shift ranges can be correlated to specific fluid concentrations.

Figure 4:
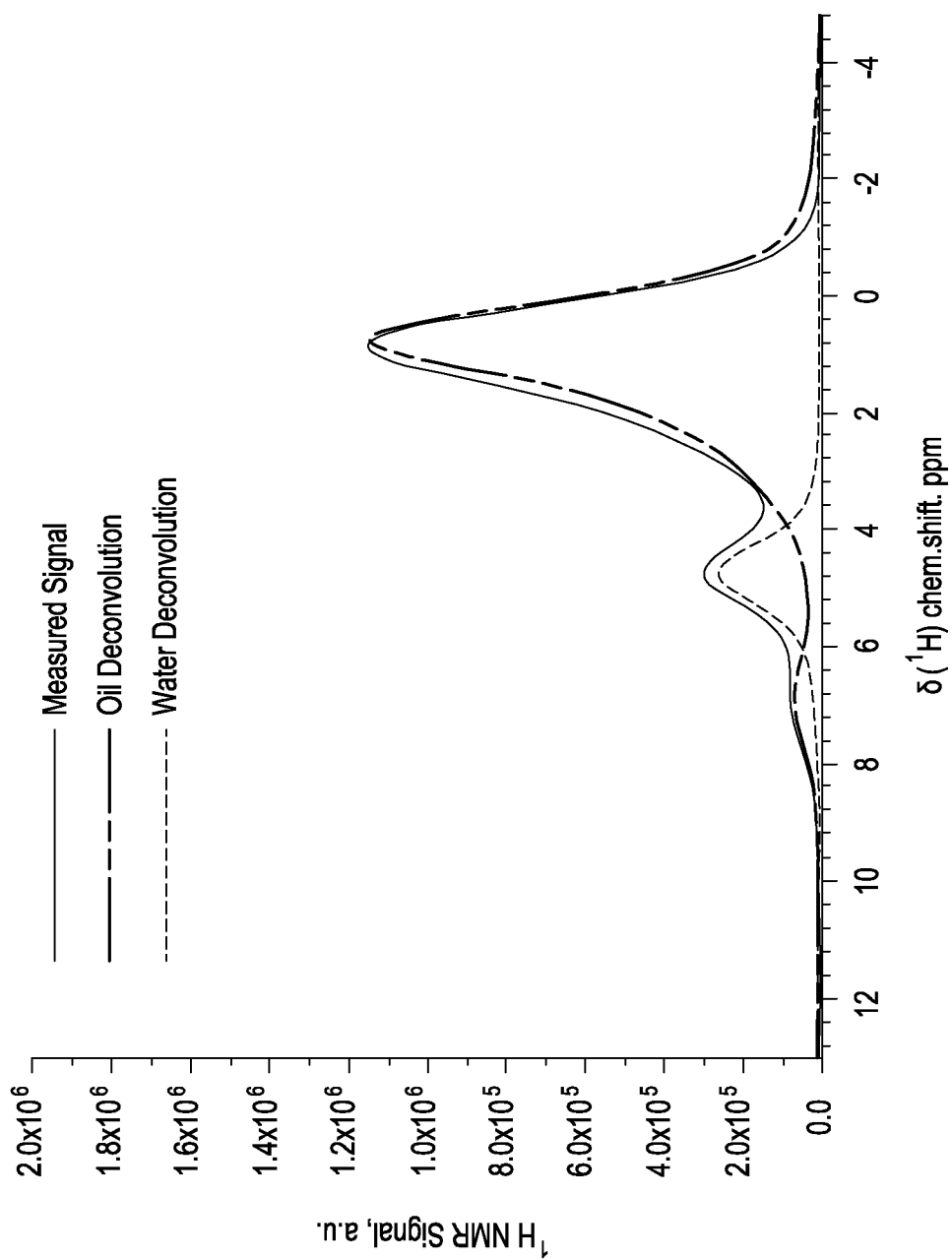
FIG. 4 is the high-field $^1$H NMR spectrum (400 MHz, 25° C., ambient pressure, spin echo) taken of the fluid in the core sample.

Example 2. The porosity was measured for a core sample from a large off-shore carbonate oil field. A crude oil hydrocarbon fluid was hydraulically exchanged for at least a portion of the fluid in the core sample, achieving irreducible water conditions FIG. 4 is the high-field $^1$H NMR spectrum (400 MHz, 25° C., ambient pressure, spin echo) taken of the fluid in the core sample. The NMR spectrum has three broad peaks from a $^1$H chemical shift of −1 ppm to 9.5 ppm. Because oil and water have different proton densities, their correlation factor from NMR signal intensity to fluid amount are different. The three broad peaks were deconvoluted with a peak centered at about 4 ppm to 6 ppm being attributed to water and the two peaks centered at about 0 ppm to 2 ppm and 6 ppm to 8 ppm being attributed to hydrocarbon (aliphatic and aromatic fractions, respectively). Comparison with scaled NMR signal from known amount of water and oil gives the fluid amount in the sample and the porosity was determined to be 24.3 BV % with 21.7 BV % being oil filled and 2.6 BV % being water filled.

Accordingly, a method of the present disclosure for determining a porosity of a core sample can include saturating a core sample with a NMR saturation fluid, wherein the core sample has a permeability of 100 mD or less, to achieve a saturated core sample; taking a NMR measurement of the saturated core sample; determining a porosity of the core sample based on a correlation between the NMR measurement and a NMR signal to fluid volume calibration, wherein the NMR measurement is $^1$H spectroscopy measured with high-field NMR and the correlation is between an area under a $^1$H spectrum of a fluid in the core sample from 10 ppm to 0 ppm and the NMR signal to fluid volume calibration.

In yet another example with a different NMR measurement, the $T_1/T_2$ ratios of the fluids can be measured. $T_1/T_2$ ratios above 1 correspond to fluid confined by the pore structure of the core sample. For example, for low-field and/or intermediate-field NMR, $1<^1$H $T_1/T_2$ ratio <100 corresponds to fluid in the pore structure of the core sample. Accordingly, an area under the curve of a plot of signal intensity as a function of $^1$H $T_1/T_2$ ratio for $1<^1$H $T_1/T_2$ ratio <100 can be correlated to a volume of fluid in the core sample and, consequently, a porosity of the core sample using a NMR signal to volume calibration. $T_1$-$T_2$ 2-dimensional correlation map is also used to define volumes of water and oil.

Accordingly, a method of the present disclosure for determining a porosity of a core sample can include saturating a core sample with a NMR saturation fluid, wherein the core sample has a permeability of 100 mD or less, to achieve a saturated core sample; taking a NMR measurement of the saturated core sample; determining a porosity of the core sample based on a correlation between the NMR measurement and a NMR signal to fluid volume calibration, wherein the NMR measurement is $^1$H $T_1/T_2$ ratio measured with low-field and/or intermediate-field NMR and the correlation is between an area under a $^1$H $T_1/T_2$ ratio of $1<^1$H $T_1/T_2$ ratio ≤100 of a fluid in the core sample and the NMR signal to fluid volume calibration.

In yet another example, the core sample can be imaged by NMR imaging methods where a $T_2$- and $T_1$-relaxation corrected signal for the fluid within the spatial boundaries of the core sample can be correlated to fluid volume and, consequently, porosity of the core sample using a NMR signal to volume calibration.

Accordingly, a method of the present disclosure for determining a porosity of a core sample can include saturating a core sample with a NMR saturation fluid, wherein the core sample has a permeability of 100 mDor less, to achieve a saturated core sample; taking a NMR measurement of the saturated core sample; determining a porosity of the core sample based on a correlation between the NMR measurement and a NMR signal to fluid volume calibration, wherein the NMR measurement is imaging measured with intermediate-field and/or high-field NMR and the correlation is between a $T_2$- and $T_1$-relaxation corrected signal for a fluid within spatial boundaries of the core sample and the NMR signal to fluid volume calibration.

In any of the foregoing example, the composition of the fluid that elutes from the core sample during hydraulic exchange can be analyzed.

Pore Type Distribution, Micropore Oil Volume, Macropore Oil Volume, Micropore Water Volume, and Macropore Water Volume Extracting oil from different size pores can require different production techniques. Generally, oil in contact with the rock can be more difficult to produce because of interactions between the rock and the oil. Therefore, larger volumes of oil in macropores may be more easily produced because the volume to surface area ratio of the macropores is greatest. Production of oil from micropores and nanopores may require additional interventions like chemical floods or steam injection. Accordingly, knowing the volume of oil in each of these pore structures may provide valuable insight to the production methods needed for different areas of the reservoir.

Conversely, water in different pore types can create different issues. Generally, water production is preferably minimal. As in oil above, water in the larger pores is more readily produced. Current methods only provide an estimated amount of water in the reservoir. However, if most of that water is in nanopores, then water production could be minimal and less costly water mitigation technique could be implemented to minimize water in the produced fluid. However, if the water is primarily in macropores, then a more aggressive approach may be used to mitigate water production. Alternatively, that portion of the formation may be bypassed for production.

Knowing the distribution of pore types and the distribution of water and/or oil in the different pore types would be useful in developing a production plan for a wellbore.

When determining a pore size distribution or volumes of fluids in different pore types, the entire porosity is preferably filled. For core samples that are not sealed with the formation fluids therein, the larger pores can be at least partially empty because fluids therein can easily flow out. Accordingly, the core sample should be first saturated with a NMR saturation fluid and maintain saturation during the NMR measurement(s). Maintaining saturation can involve either maintaining the core sample submerged in a fluid bath and/or in a pressure cell.

The NMR response of fluids in different pore types is affected by the volume to surface area ratio and the relative confinement. For the volume to surface area ratio, the composition of the rock in the formation can influence a nuclei's NMR response when in close proximity to the rock surface. Therefore, the composition of the rock has less influence on the NMR response of fluids in macropores as compared to nanopores. Relative confinement is similar except it is the mobility of the fluid molecule within the pore. Because nanopores are so small the natural movement of the fluid therein is limited. As fluid mobility is limited, the molecules may assemble or orient to some degree and the neighboring fluid molecules could have an effect on a nuclei's NMR responses.

Because of the volume to surface area ratio and the relative confinement of fluids within the different pores, the fluids in the different pores have different NMR responses. For example, fluids in nanopores are the most confined and interact with the rock the most. Accordingly, the fluids in nanopores have a shorter $T_2$ relaxation time. The fluids in micropores are less confined and interact less with the rock and, therefore, have longer $T_2$ relaxation times. Continuing the trend, the fluid in macropores have even longer $T_2$ relaxation times, followed by external or free fluid with the longest $T_2$ relaxation times.

The exact ranges of $T_2$ relaxation times and $T_1/T_2$ ratios associated with each of the pore types will depend on the composition of the rock and the pore surface, the composition of the fluids, the magnetic field strength, and the temperature of the sample. Tables 1 and 2 provide two nonlimiting examples of conditions with the corresponding $^1H$ NMR $T_2$ relaxation time ranges and $^1H$ $T_1/T_2$ ratio ranges, respectively. Other nuclei, magnetic fields, and measurement conditions can be used, and the $T_2$ relaxation time ranges and $T_1/T_2$ ratio ranges corresponding to pore type can be readily determined by one skilled in the art based on the teachings of the present disclosure.

TABLE 1

| Parameters | |
| --- | --- |
| Temperature | 25° C. |
| NMR Acquisition Parameters | low-field and/or intermediate-field NMR |

| $T_2$ Relaxation Ranges | |
| --- | --- |
| Pore Type | Range |
| Nanopores | 0.1 ms ≤ $T_2$ < 1.5 ms |
| Micropores | 1.5 ms ≤ $T_2$ < 30 ms |
| Macropores | 30 ms ≤ $T_2$ < 300 ms |
| External or Free Fluid | 300 ms and greater |

TABLE 2

| Parameters | |
| --- | --- |
| Temperature | 25° C. |
| NMR Acquisition Parameters | low-field and/or intermediate-field NMR |

| $T_1/T_2$ Ratio Ranges | |
| --- | --- |
| Pore Type | Range |
| Nanopores | 10 < $T_1/T_2$ ≤ 100 |
| Micropores | 3 < $T_1/T_2$ ≤ 10 |
| Macropores | 1 < $T_1/T_2$ ≤ 3 |
| External or Free Fluid | $T_1/T_2$ = 1 |

Once the NMR measurements are performed, the area under the $T_2$ spectrum relates to the volume of fluid in the pores. Knowing the porosity or, more specifically, the volume of voids in the core sample, the area under the $T_2$ spectrum for the three pore types (0.1 ms≤$T_2$<300 ms) cumulatively can be assigned to 100% of volume of voids. Then, the percentage of area under the $T_2$ spectrum for each individual pore type relative to the total area under the $T_2$ spectrum up to 300 ms corresponds to a percent volume, from which total volume for each individual pore type can be extrapolated.

In an example method, the fluid in a core sample is hydraulically exchanged for an exchange fluid, preferably at least two pore volumes worth of exchange fluid. Then, a low-field NMR can be used in relaxometery mode for collecting $T_2$ relaxation times with a variable refocusing delay time τ. Then, the total proton content (which relates to the total fluid present as described above) for each of the ranges in Table 1 is correlated to the volume of fluid in each pore type and, consequently, a pore type distribution.

For another example, a method of the present disclosure for determining volumes of fluids in a pore type can include determining a porosity of a core sample, wherein the core sample has a permeability of 100 mD or less; saturating the core sample with NMR saturation fluid to achieve a saturated core sample; taking a NMR measurement of fluids in the saturated core sample, wherein NMR measurement is $^1H$ $T_2$ relaxation times measured with low-field and/or intermediate-field NMR; deriving a volume for a pore type based on the porosity and a correlation between the NMR measurement and a NMR signal to fluid volume calibration, wherein the pore type is selected from the group consisting of a nanopore, a micropore, a macropore, and any combination thereof, wherein the correlation is between the NMR signal to fluid volume calibration and an area under a $^1H$ $T_2$ relaxation time spectrum for one selected from the group consisting of 0.1 ms≤$T_2$<1.5 ms for the nanopores, 1.5 ms≤$T_2$<30 ms for the micropores, 30 ms≤$T_2$<300 ms for the macropores, and any combination thereof.

Figure 5:
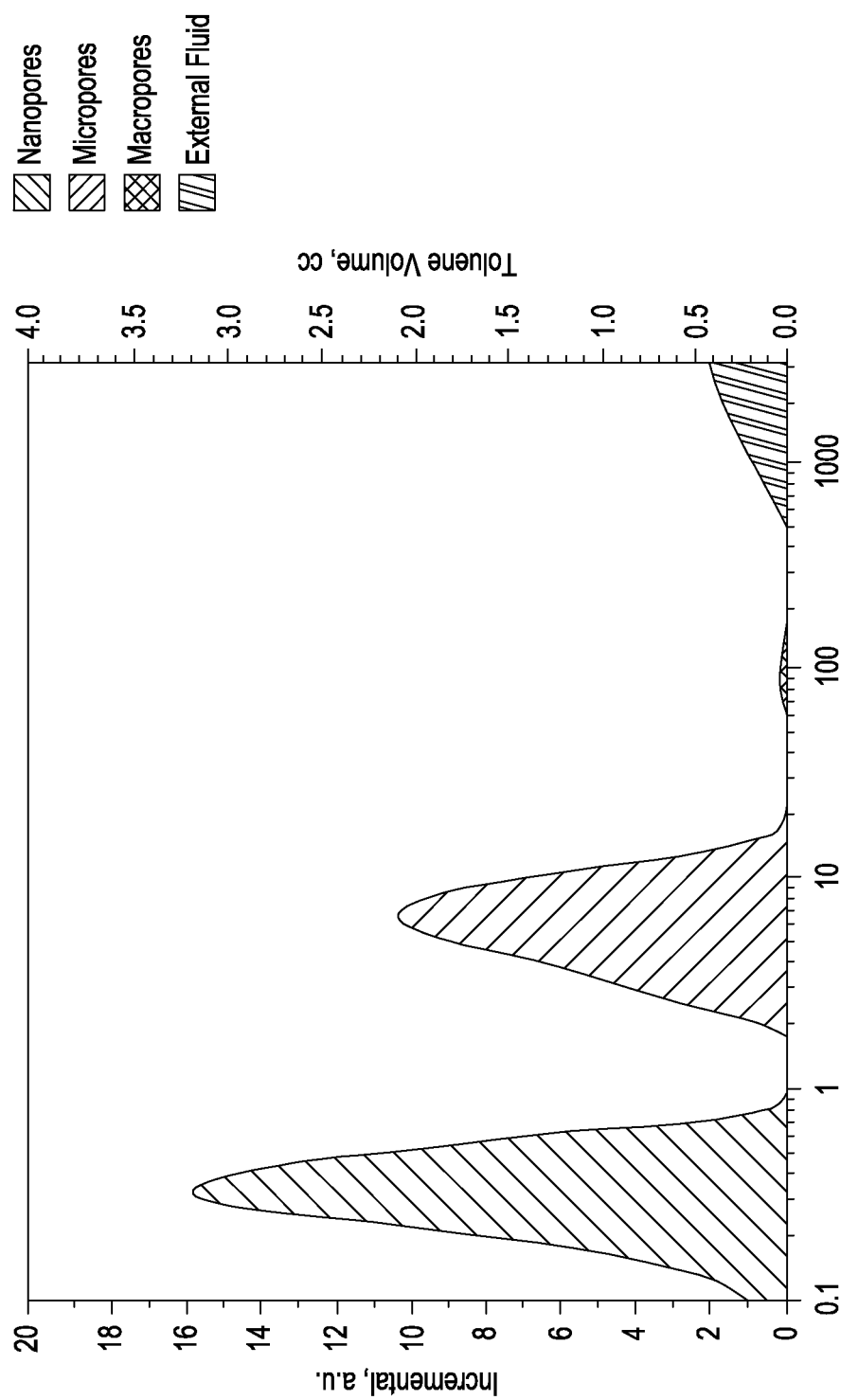
FIG. 5 is the $T_2$ spectrum for the core sample with pore types labeled.

Example 3—A the fluid in a core sample (a shale core sample) was hydraulically exchanged for toluene. $T_2$ relaxation measurements (2 MHz, CPMG pulse sequence, 25° C., confinement pressure 4,500 psig, pore pressure 3,500 psig) were performed on the fluids of the core samples. FIG. 5 is the $T_2$ spectra for the core sample with pore types labeled.

The nanopores contain about 1.99 cm³ of toluene, the micropores contain about 1.37 cm³ of toluene, the macropores contain about 0.037 cm³ of toluene, and the external fluid contains about 0.22 cm³ of toluene. Therefore, the pore type distribution is about 59 PV % nanopores, about 40 PV % micropores, and about 1 PV % macropores.

Similar to the previous example based on Table 1, an example based on Table 2 is a method of the present disclosure for determining volumes of fluids in a pore type that includes determining a porosity of a core sample, wherein the core sample has a permeability of 100 mD or less; saturating the core sample with a NMR saturation fluid to achieve a saturated core sample; taking a NMR measurement of fluids in the saturated core sample, wherein the NMR measurement is $^1$H $T_1/T_2$ ratio measured with low-field and/or intermediate-field NMR; deriving a volume for a pore type based on the porosity and a correlation between the NMR measurement and a NMR signal to fluid volume calibration, wherein the pore type is selected from the group consisting of a nanopore, a micropore, a macropore, and any combination thereof, wherein the correlation is between the NMR signal to fluid volume calibration and the $^1$H $T_1/T_2$ ratio for one selected from the group consisting of $10 \leq ^1$H $T_1/T_2 < 100$ for the nanopores, $3 \leq ^1$H $T_1/T_2 < 10$ for the micropores, $1 \leq ^1$H $T_1/T_2 < 3$ for the macropores, and any combination thereof.

In another example using a different NMR measurement, a $^1$H $T_1$-$T_2$ 2-dimensional correlation map can be analyzed to determine volumes of fluids in a pore type. For example, a method of the present disclosure for determining volumes of fluids in a pore type can include determining a porosity of a core sample, wherein the core sample has a permeability of 100 mD or less; saturating the core sample with a NMR saturation fluid to achieve a saturated core sample; taking a NMR measurement of fluids in the saturated core sample, wherein the NMR measurement is $^1$H $T_1$-$T_2$ 2-dimensional correlation map measured with low-field and/or intermediate-field NMR; deriving a volume for a pore type based on the porosity and a correlation between the NMR measurement and a NMR signal to fluid volume calibration, wherein the pore type is selected from the group consisting of a nanopore, a micropore, a macropore, and any combination thereof, wherein the correlation is between the NMR signal to fluid volume calibration and an area under the $^1$H $T_1$-$T_2$ 2-dimensional correlation map for one selected from the group consisting of 0.1 ms≤$T_2$<1.5 ms for the nanopores, 1.5 ms≤$T_2$<30 ms for the micropores, 30 ms≤$T_2$<300 ms for the macropores, and any combination thereof.

In yet another example using another NMR measurement, $T_2$-weighted imaging of the fluids within the spatial boundaries of the core sample can be analyzed to determine volumes of fluids in a pore type. For example, a method of the present disclosure for determining volumes of fluids in a pore type can include determining a porosity of a core sample, wherein the core sample has a permeability of 100 mD or less; saturating the core sample with a NMR saturation fluid to achieve a saturated core sample; taking a NMR measurement of fluids in the saturated core sample, wherein the NMR measurement is $T_2$-weighted imaging; deriving a volume for a pore type based on the porosity and a correlation between the NMR measurement and a NMR signal to fluid volume calibration, wherein the pore type is selected from the group consisting of a nanopore, a micropore, a macropore, and any combination thereof, wherein the correlation is between the NMR signal to fluid volume calibration and a $T_2$- and $T_1$-relaxation corrected signal for the fluids within spatial boundaries of the core sample where the $T_2$-weight is 0.1 ms≤$T_2$<1.5 ms for the nanopores, where the $T_2$-weight is 1.5 ms≤$T_2$<30 ms for the micropores, and where the $T_2$-weight is for 30 ms≤$T_2$<300 ms for the macropores.

Figure 6:
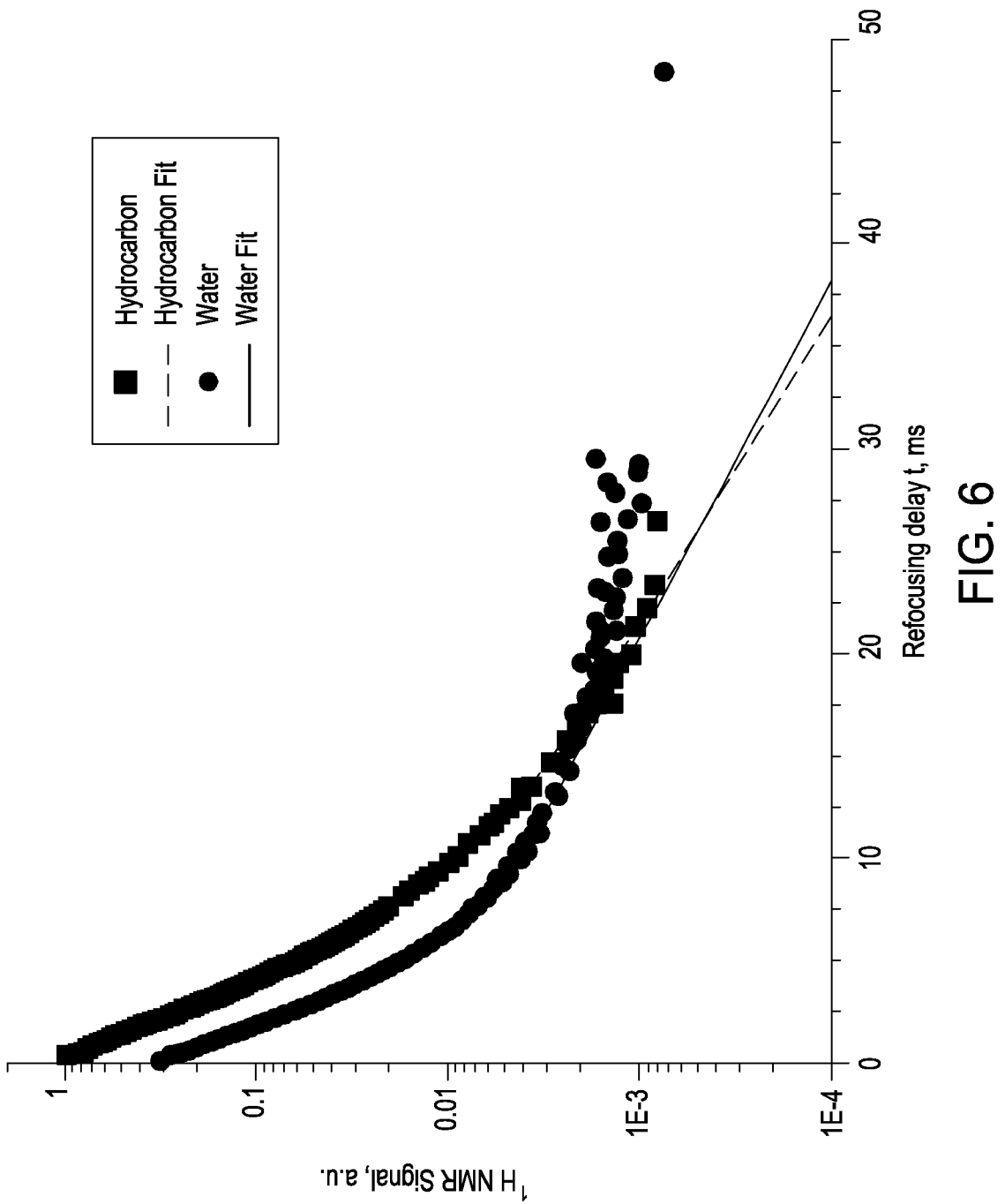
FIG. 6 is a plot of the NMR signal as a function of refocusing delay τ was measured for chemical shifts that correspond to protons of water and the protons of hydrocarbons.

In another example using a different NMR measurement, spectroscopically resolved spin echo with the refocusing delay τ with a high-field NMR provides the $T_2$ signal at the specified chemical shifts and a relative concentration of oil in nanopores, micropores, and macropores and a relative concentration of water in nanopores, micropores, and macropores (e.g., as illustrated relative to FIG. 6). FIG. 6 is a plot of the refocusing delay where each of the plots corresponds to a chemical shift of the peaks in FIG. 4. So, there are two refocusing plots for the hydrocarbon fluid and the water in the core sample. Each set of data is a fit (e.g., to a 2-exponential fit in this example or to a 3-exponential fit). For this FIG. 6 example, the slope of the two exponential factors is related to $T_2$ time, which can be corresponded to a pore type with a calibration experiment. Because this a high-field NMR experiment, the $T_2$ relaxation times will likely not correspond to the low-field $T_2$ relaxation times of Table 1. Further, the corresponding pre-exponential factors for the 2-exponential fit relate to the volumes of fluid in the pore types for which the slope of the exponent corresponds. In this example, there is no detectable fluid in nanopores. However, core samples with all three pore types can be analyzed similarly with a 3-exponential fit.

Example 4—A carbonate core sample was saturated with oil and water. The spectroscopically resolved spin echo with the refocusing delay τ was acquired at the specified chemical shifts corresponding to each of the peaks in FIG. 4. Using NMR signal to fluid volume calibration and the relative NMR signals, the oil in the core sample was determined to be 97% in micropores and 3% in macropores, and the water in the core sample was determined to be 92% in micropores and 8% in macropores. Then, using a volume percent of each in the total porosity (e.g., as described relative to FIG. 4), the amount of oil and water in the micropores and macropores (i.e., the micropore oil volume, the macropore oil volume, the micropore water volume, and the macropore water volume) can be determined. Using the oil and water amounts determined in Example 2, the micropore oil volume is 21 BV %, the macropore oil volume is 0.7 BV %, the micropore water volume is 2.4 BV %, and the macropore water volume is 0.2 BV %. Therefore, oil saturation is 21.7 BV %, water saturation is 2.6 BV %, and total fluid filled porosity is 24.3 BV %.

Accordingly, a method of the present disclosure for determining volumes of fluids in a pore type can include determining a porosity of a core sample, wherein the core sample has a permeability of 100 mD or less; saturating the core sample with a MR saturation fluid to achieve a saturated core sample; taking a NMR measurement of fluids in the saturated core sample, the NMR measurement is $T_2$ NMR signal intensity as a function of refocusing delay; deriving a volume for a pore type based on the porosity and a correlation between the NMR measurement and a NMR signal to fluid volume calibration, wherein the pore type is selected from the group consisting of a nanopore, a micropore, a macropore, and any combination thereof, wherein the correlation is between the NMR signal to fluid volume calibration and a multi-exponential fit (e.g., a 2-exponential fit or to a 3-exponential fit) of the $T_2$ NMR signal intensity as a function of refocusing delay where a slope of each exponential factor in the multi-exponential fit relates to the pore type and a pre-exponential factor of each exponential factor in the multi-exponential fit relates to the volume of the pore type.

In yet another example method, diffusion NMR (also referred to as self-diffusion NMR) measurements can be used to determine the pore type distribution and the fluids in each pore type. Diffusion NMR techniques combine RF pulse with magnetic field gradients to identify spatial movement of molecules within the fixed observation time. The more intense and longer the magnetic gradient pulse in these techniques, the more spatially selective the technique is. By monitoring specific chemical shifts that correspond to water and/or hydrocarbons (as described in FIG. 4), the distribution of oil and water mobility is obtained. Further, because the method provides the distance the molecules diffuse over a specific time period, the fraction and volume of fluid in micropores (shorter travel distance) and macropores (longer travel distance) or in thin layers on the surface of the rock can also be determined after correction on signal losses due to $T_2$ and $T_1$ processes, which observed molecules experience during the coding and decoding experiment.

Example 5—Control samples were prepared with water and/or hydrocarbon not confined, in microcarbonate pores (simulating micropores), and in zeolite pores (simulating nanopores) to identify self-diffusion values for each. The particles were loaded with water or hydrocarbon (dodecane in this example) and the diffusion rates were measured by NMR (stimulated echo, $t_d$=100 ms, $\tau$=3.5 ms, $\delta$-3 ms, and g=75 G/cm). Table 3 includes diffusion rate ranges for the various pore type sizes for different fluids.

TABLE 3

| | Diffusion Rate (DR) (m²/s) | |
|---|---|---|
| Pore Type | Water | Hydrocarbon |
| Not confined and macropores | $2.7 \times 10^{-9}$ m²/s < DR | $1 \times 10^{-9}$ m²/s < DR |
| Micropores | $1 \times 10^{-11}$ m²/s < DR ≤ $2.7 \times 10^{-9}$ m²/s | $1 \times 10^{-11}$ m²/s < DR ≤ $1 \times 10^{-9}$ m²/s |
| Nanopores | $1 \times 10^{-14}$ m²/s < DR ≤ $1 \times 10^{-11}$ m²/s | $1 \times 10^{-14}$ m²/s < DR ≤ $1 \times 10^{-11}$ m²/s * |

* Hydrocarbon would not load into the zeolite, so this is an estimated range.

Figure 7:
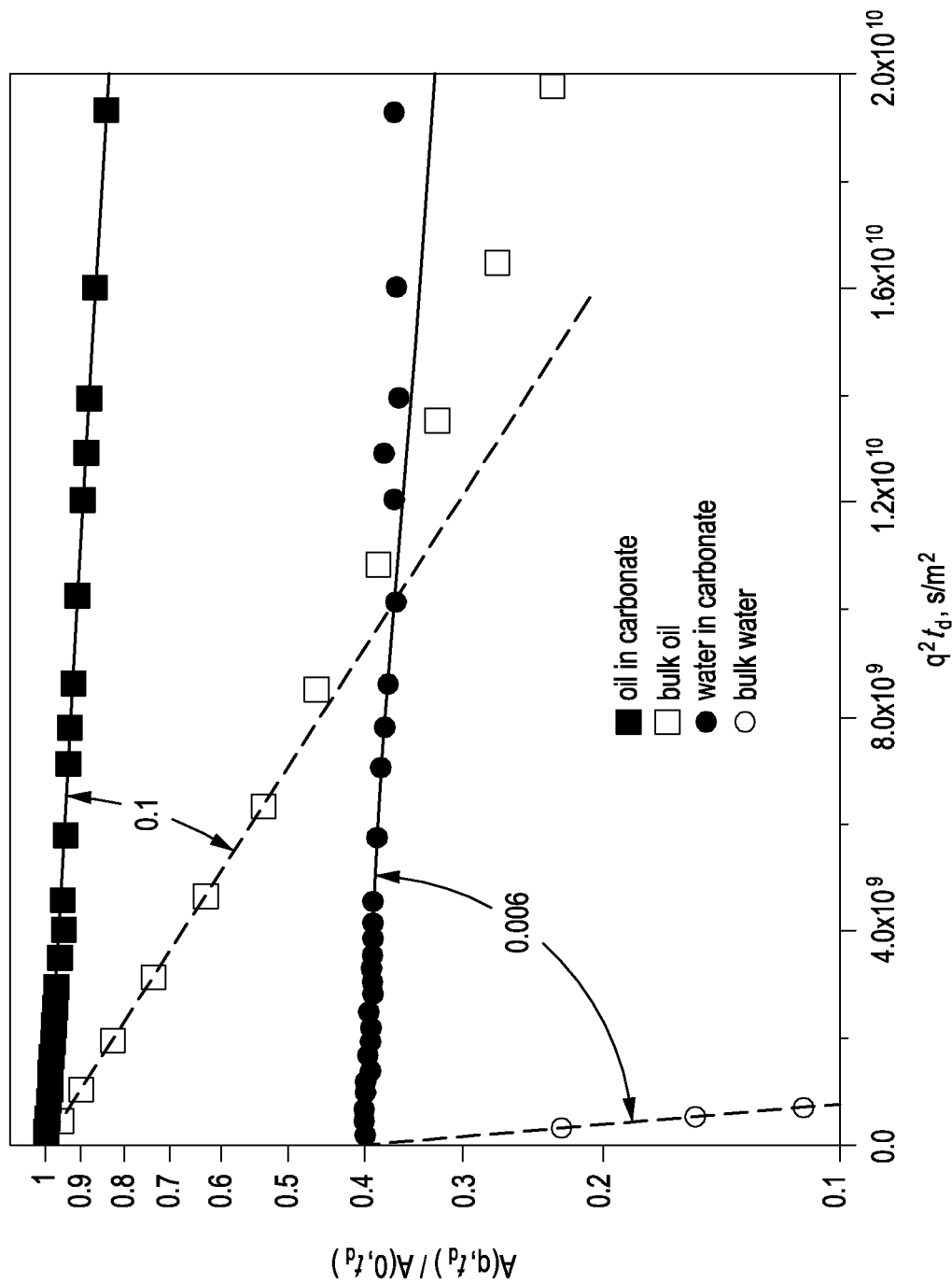
FIG. 7 is a plot of NMR signal decay as a function of magnetic field gradient expressed in q-vector.

Diffusion NMR data (stimulated echo, $t_d$=100 ms, $\tau$=3.5 ms, $\delta$-3 ms, and g=75 G/cm) was collected on the core sample of Example 2. FIG. 7 compares the spectroscopically resolved NMR signal decays from water and oil in the rock sample with bulk water and bulk oil as a function of magnetic field gradient expressed in q-vector values, which are the combination of NMR sequence parameters (e.g., gradient field intensity, gradient field duration, gyromagnetic ratio of nuclei) that give a spatial vector of 1/m². Mobility of oil in the rock sample is reduced by the factor of approximately 0.1 relative to the diffusion of oil not confined. Water mobility in the core sample is reduced by the factor of 0.006 suggesting water location in smaller pores.

This example illustrates methods by which the pore type can be determined using diffusion NMR data. It should be noted that the hydrocarbon diffusion rate is dependent on the viscosity and structure of the hydrocarbon. Accordingly, it is preferred to use hydrocarbon fluids that are relatively small and have good diffusion to mitigate composition dependent artifacts in the diffusion rates. For example, ISOPAR™ and $C_5$-$C_{15}$ hydrocarbons are preferred.

Accordingly, a method of the present disclosure for determining volumes of fluids in a pore type can include determining a porosity of a core sample, wherein the core sample has a permeability of 100 mD or less; saturating the core sample with a NMR saturation fluid to achieve a saturated core sample; taking a NMR measurement of fluids in the saturated core sample, wherein the NMR measurement is diffusometry; deriving a volume for a pore type based on the porosity and a correlation between the NMR measurement and a NMR signal to fluid volume calibration, wherein the pore type is selected from the group consisting of a nanopore, a micropore, a macropore, and any combination thereof, wherein the correlation is between the NMR signal to fluid volume calibration and a $T_2$- and $T_1$-relaxation corrected area under a diffusion spectrum of the fluids in the core sample for $1 \times 10^{-14}$ m²/s<diffusion rate≤$1 \times 10^{-11}$ m²/s for nanopores and/or for $1 \times 10^{-11}$ m²/s<diffusion rate≤$1 \times 10^{-9}$ m²/s for micropores.

Recoverable Oil Volume, Recoverable Water Volume, Irreducible Hydrocarbon Volume, Irreducible Water Volume, and Immobile Fluid Volume Recoverable oil volume, recoverable water volume, irreducible hydrocarbon volume, irreducible water volume, and immobile fluid volume are interrelated properties of the core sample. The immobile fluid volume is the sum of the irreducible hydrocarbon volume and the irreducible water volume; and the porosity is the sum of the recoverable oil volume, the recoverable water volume, and the immobile fluid volume.

These properties can be determined using NMR measurements at various stages of hydraulic exchange methods performed on a core sample saturated with a NMR saturation fluid. For example, a first NMR measurement of a saturated core sample where the fluid in the core sample has a NMR signal. Then, the saturated core sample is hydraulically exchanged with a hydrophilic NMR exchange fluid followed by a second NMR measurement where the loss of NMR signal corresponds to the hydrophobic fluid being forced out of the core sample, which is the recoverable oil volume. Then, the saturated core sample can be hydraulically exchanged with a hydrophobic NMR exchange fluid followed by a third NMR measurement where the loss of NMR signal corresponds to the hydrophilic fluid being forced out of the core sample, which is the recoverable water volume. The NMR signal from fluid remaining in the core sample is the immobile fluid volume, which can be differentiated into irreducible hydrocarbon volume and irreducible water volume by the third NMR measurement and/or a fourth NMR measurement.

In another example, a first NMR measurement of a saturated core sample where the fluid in the core sample has a NMR signal. Then, the saturated core sample is hydraulically exchanged with a hydrophobic NMR exchange fluid followed by a second NMR measurement where the loss of NMR signal corresponds to the hydrophilic fluid being forced out of the core sample, which is the recoverable oil volume. Then, the saturated core sample can be hydraulically exchanged with a hydrophilic NMR exchange fluid followed by a third NMR measurement where the loss of NMR signal corresponds to the hydrophobic fluid being forced out of the core sample, which is the recoverable water volume. The NMR signal from fluid remaining in the core sample is the immobile fluid volume, which can be differentiated into irreducible hydrocarbon volume and irreducible water volume by the third NMR measurement and/or a fourth NMR measurement.

Each of the foregoing methods alternatively can be completed with only the first hydraulic exchange to determine the corresponding recoverable fluid volume if no other properties need to be determined.

The NMR measurements can be used to identify the fluids and amount of said fluids being forced from the core sample. Said NMR measurements can be those described herein for determining porosity, which include, but are not limited to, the area under high-field $^1$H NMR spectrum (e.g., as described relative to FIG. 4); the values of $T_2$ relaxation times (e.g., 0.1 ms≤$^1$H $T_2$<300 ms); the values of $T_1/T_2$ ratios (e.g., 1<$^1$H $T_1/T_2$≤100); the area under an extrapolation of a $T_2$ NMR signal intensity (e.g., as described relative to FIG. 3); the area under a $T_1$-$T_2$ relaxation time plot; the $T_2$ and $T_1$-relaxation corrected signals within the spatial boundaries of the core sample; and the like; and any combination thereof.

For example, a method of the present disclosure for assessing fluid mobility in a core sample can include determining a porosity of a core sample, wherein the core sample has a permeability of 100 mD or less; saturating the core sample with a NMR saturation fluid; taking a first NMR measurement of fluid in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid; and optionally, repeating the hydraulic exchange with the other of the hydrophobic fluid or the hydrophilic fluid and taking a third NMR measurement and deriving the property of the first or second group, wherein the NMR measurements are $^1$H $T_2$ relaxation times measured with low-field and/or intermediate-field NMR and the comparison is a change in an area under a $^1$H $T_2$ relaxation time spectrum of the core sample from 0.1 ms to 300 ms.

In another example, a method of the present disclosure for assessing fluid mobility in a core sample can include determining a porosity of a core sample, wherein the core sample has a permeability of 100 mD or less; saturating the core sample with a NMR saturation fluid; taking a first NMR measurement of fluid in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid; and optionally, repeating the hydraulic exchange with the other of the hydrophobic fluid or the hydrophilic fluid and taking a third NMR measurement and deriving the property of the first or second group, wherein the NMR measurements are $^1$H $T_1$-$T_2$ 2-dimensional correlation map measured with low-field and/or intermediate-field NMR and the comparison is a change in an area under a $^1$H $T_1$-$T_2$ relaxation time plot of fluid in the core sample from $T_2$ of 0.1 ms to 300 ms and $T_1$ of 0.1 ms to 300 ms and the NMR signal to fluid volume calibration.

In yet another example, a method of the present disclosure for assessing fluid mobility in a core sample can include determining a porosity of a core sample, wherein the core sample has a permeability of 100 mD or less; saturating the core sample with a NMR saturation fluid; taking a first NMR measurement of fluid in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid; and optionally, repeating the hydraulic exchange with the other of the hydrophobic fluid or the hydrophilic fluid and taking a third NMR measurement and deriving the property of the first or second group, wherein the NMR measurements are $^1$H $T_1/T_2$ ratio measured with low-field and/or intermediate-field NMR and the comparison is a change in an area an area under a $^1$H $T_1/T_2$ ratio of 1<$^1$H $T_1/T_2$ ratio≤100 of a fluid in the core sample.

In another example, a method of the present disclosure for assessing fluid mobility in a core sample can include determining a porosity of a core sample, wherein the core sample has a permeability of 100 mD or less; saturating the core sample with a NMR saturation fluid; taking a first NMR measurement of fluid in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid; and optionally, repeating the hydraulic exchange with the other of the hydrophobic fluid or the hydrophilic fluid and taking a third NMR measurement and deriving the property of the first or second group, wherein the NMR measurements are $T_2$ NMR signal intensity as a function of refocusing delay and the comparison is in a y-value at a y-intercept of an extrapolation of the $T_2$ NMR signal intensity including x=0.

In yet another example, a method of the present disclosure for assessing fluid mobility in a core sample can include determining a porosity of a core sample, wherein the core sample has a permeability of 100 mD or less; saturating the core sample with a NMR saturation fluid; taking a first NMR measurement of fluid in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid; and optionally, repeating the hydraulic exchange with the other of the hydrophobic fluid or the hydrophilic fluid and taking a third NMR measurement and deriving the property of the first or second group, wherein the NMR measurements are $^1$H spectroscopy measured with high-field NMR and the comparison is a change in an area under a $^1$H spectrum of a fluid in the core sample from 10 ppm to 0 ppm.

In another example, a method of the present disclosure for assessing fluid mobility in a core sample can include determining a porosity of a core sample, wherein the core sample has a permeability of 100 mD or less; saturating the core sample with a NMR saturation fluid;

taking a first NMR measurement of fluid in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid; and optionally, repeating the hydraulic exchange with the other of the hydrophobic fluid or the hydrophilic fluid and taking a third NMR measurement and deriving the property of the first or second group, wherein the NMR measurements are imaging measured with intermediate-field and/or high-field NMR the comparison is a change in a $T_2$- and $T_1$-relaxation corrected signal for a fluid within spatial boundaries of the core sample and the NMR signal to fluid volume calibration.

Further, the NMR measurements can be used to identify which pore types the fluids being forced from and the amount of said fluids by pore type. Said NMR measurements can be those described for pore types, which include, but are not limited to, the values of $T_2$ relaxation times (e.g., $^1$H $T_2$ values of Table 1); the values of $T_1/T_2$ ratios (e.g., $^1$H $T_1/T_2$ ratios of Table 2); $T_2$ signal intensity as a function of refocusing delay; the $T_2$ and $T_1$-relaxation corrected signals within the spatial boundaries of the core sample; and the like; and any combination thereof. Accordingly, one or more of the following can be determined: a recoverable nanopore oil volume, a recoverable micropore oil volume, a recoverable macropore oil volume, a recoverable nanopore water volume, a recoverable micropore water volume, a recoverable macropore water volume, an irreducible nanopore hydrocarbon volume, an irreducible micropore hydrocarbon volume, an irreducible macropore hydrocarbon volume, an irreducible nanopore water volume, an irreducible micropore water volume, an irreducible macropore water volume, an immobile nanopore volume, an immobile micropore volume, an immobile macropore volume, and any combination thereof.

For example, the NMR measurements can be $^1$H $T_2$ relaxation times where the reduction of $T_2$ signal intensity for over $T_2$ relaxation time ranges per Table 1 can be used to identify a volume of recoverable water in each pore type (when a hydrophobic NMR exchange fluid is used) and/or identify a volume of recoverable hydrocarbon in each pore type (when a hydrophilic NMR exchange fluid is used).

Accordingly, a method of the present disclosure for determining the mobility of fluids in different pore types can include determining a porosity of a core sample, wherein the core sample has a permeability of mD or less; saturating the core sample with a NMR saturation fluid to achieve a saturated core sample; taking a first NMR measurement of the fluid in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. and optionally, repeating the hydraulic exchange with the other of the hydrophobic fluid or the hydrophilic fluid and taking a third NMR measurement for comparison to the second NMR measurement to determine the first or second group of properties, wherein the NMR measurement is $^1$H $T_2$ relaxation times measured with low-field and/or intermediate-field NMR and the comparison is a change in an area under a $^1$H $T_2$ relaxation time spectrum for one selected from the group consisting of 0.1 ms≤$T_2$<1.5 ms for the nanopore volumes, 1.5 ms≤$T_2$<30 ms for the micropore volumes, 30 ms≤$T_2$<300 ms for the macropore volumes, and any combination thereof.

In another example, a method of the present disclosure for determining the mobility of fluids in different pore types can include determining a porosity of a core sample, wherein the core sample has a permeability of mD or less; saturating the core sample with a NMR saturation fluid to achieve a saturated core sample; taking a first NMR measurement of the fluid in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. and optionally, repeating the hydraulic exchange with the other of the hydrophobic fluid or the hydrophilic fluid and taking a third NMR measurement for comparison to the second NMR measurement to determine the first or second group of properties, wherein the NMR measurement is $^1H$ $T_1$-$T_2$ 2-dimensional correlation map measured with low-field and/or intermediate-field NMR and the comparison a change in an area under the $^1H$ $T_1$-$T_2$ 2-dimensional correlation map for one selected from the group consisting of 0.1 ms≤$T_2$<1.5 ms for the nanopore volumes, 1.5 ms≤$T_2$<30 ms for the micropore volumes, 30 ms≤$T_2$<300 ms for the macropore volumes, and any combination thereof.

In yet another example, a method of the present disclosure for determining the mobility of fluids in different pore types can include determining a porosity of a core sample, wherein the core sample has a permeability of mD or less; saturating the core sample with a NMR saturation fluid to achieve a saturated core sample; taking a first NMR measurement of the fluid in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. and optionally, repeating the hydraulic exchange with the other of the hydrophobic fluid or the hydrophilic fluid and taking a third NMR measurement for comparison to the second NMR measurement to determine the first or second group of properties, wherein the NMR measurement is $T_2$-weighted imaging and the comparison is for a change in a $T_2$- and $T_1$-relaxation corrected signal for the fluids within spatial boundaries of the core sample where the $T_2$-weight is 0.1 ms≤$T_2$<1.5 ms for the nanopore volumes, where the $T_2$-weight is 1.5 ms≤$T_2$<30 ms for the micropore volumes, and where the $T_2$-weight is for 30 ms≤$T_2$<300 ms for the macropore volumes.

In another example, a method of the present disclosure for determining the mobility of fluids in different pore types can include determining a porosity of a core sample, wherein the core sample has a permeability of mD or less; saturating the core sample with a NMR saturation fluid to achieve a saturated core sample; taking a first NMR measurement of the fluid in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. and optionally, repeating the hydraulic exchange with the other of the hydrophobic fluid or the hydrophilic fluid and taking a third NMR measurement for comparison to the second NMR measurement to determine the first or second group of properties, wherein the NMR measurement is a $^1H$ $T_1/T_2$ ratio measured with low-field and/or intermediate-field NMR and the comparison is a change in the $^1H$ $T_1/T_2$ ratio for one selected from the group consisting of 10≤$^1H$ $T_1/T_2$<100 for the nanopore volumes, 3≤$^1H$ $T_1/T_2$<10 for the micropore volumes, 1≤$^1H$ $T_1/T_2$<3 for the macropore volumes, and any combination thereof.

In yet another example, a method of the present disclosure for determining the mobility of fluids in different pore types can include determining a porosity of a core sample, wherein the core sample has a permeability of mD or less; saturating the core sample with a NMR saturation fluid to achieve a saturated core sample; taking a first NMR measurement of the fluid in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. and optionally, repeating the hydraulic exchange with the other of the hydrophobic fluid or the hydrophilic fluid and taking a third NMR measurement for comparison to the second NMR measurement to determine the first or second group of properties, wherein the NMR measurement is $T_2$ NMR signal intensity as a function of refocusing delay and the comparison a change in a multi-exponential fit of the $T_2$ NMR signal intensity as a function of refocusing delay where a slope of each exponential factor in the multi-exponential fit relates to a pore type and a pre-exponential factor of each exponential factor in the multi-exponential fit relates to a volume of the pore type.

In another example, a method of the present disclosure for determining the mobility of fluids in different pore types can include determining a porosity of a core sample, wherein the core sample has a permeability of mD or less; saturating the core sample with a NMR saturation fluid to achieve a saturated core sample; taking a first NMR measurement of the fluid in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. and optionally, repeating the hydraulic exchange with the other of the hydrophobic fluid or the hydrophilic fluid and taking a third NMR measurement for comparison to the second NMR measurement to determine the first or second group of properties, wherein the NMR measurement is diffusometry and the comparison is a change a $T_2$- and $T_1$-relaxation corrected area under a diffusion spectrum of the fluids in the core sample for $1 \times 10^{-14}$ m$^2$/s<diffusion rate≤$1 \times 10^{-11}$ m$^2$/s for nanopore volumes and/or for $1 \times 10^{-11}$ m$^2$/s<diffusion rate≤$1 \times 10^{-9}$ m$^2$/s for micropore volumes.

Calibrating NMR Logs

One or more of the core sample attributes described herein (e.g., porosity, pore type distribution, nanopore oil volume, nanopore water volume, micropore oil volume, micropore water volume, macropore oil volume, macropore water volume, oil saturation volume, water saturation volume, recoverable oil volume, recoverable water volume, irreducible oil volume, irreducible water volume, and immobile fluid volume, described further herein) can be used to calibrate a NMR log of a wellbore. For example, one or more core samples taken from known locations along a wellbore can be analyzed for one or more core sample attributes. Further, a NMR log of the wellbore can be measured. Measurements of $T_2$ and $T_1$ relaxation as well as fluid mobility and combinations thereof provide properties of the fluid and the reservoir. Then, the locations along the wellbore where the core samples and NMR log correspond can be identified. At those locations, the NMR log signal or properties derived therefrom (e.g., porosity, mobile oil, mobile water, and the like) can be corrected to match the measurements and/or analyses of the core samples.

In a nonlimiting example, the NMR log can be used to derive a formation porosity as a function of length of the wellbore. Then, for example, the NMR log-derived formation porosity can be compared to the core sample-derived porosity at locations along the wellbore where the core samples were taken. If the two porosities are within a threshold (e.g., about 5%) for some minimum number of location then the NMR log-derived formation porosity may be considered within calibration. However, when outside a threshold at some minimum number of locations, then using some or all of the locations, a calibration factor or equation can be derived and applied to the NMR log-derived formation porosity to bring them within the threshold.

The number of core samples analyzed as a function of distance along the wellbore is dependent number of strata within the formation and the desired level of quality for the calibration. By way of nonlimiting example, 2-3 core samples per strata may provide a balance between cost (retrieval of core samples and subsequent analysis) and time and accuracy. However, as few as 1 or as many as 50 or more core samples can be taken from the strata of interest.

Artificial NMR Logs

One or more of the core sample attributes described herein (e.g., porosity, pore type distribution, nanopore oil volume, nanopore water volume, micropore oil volume, micropore water volume, macropore oil volume, macropore water volume, oil saturation volume, water saturation volume, recoverable oil volume, recoverable water volume, irreducible oil volume, irreducible water volume, and immobile fluid volume, described further herein) can be used to produce an artificial NMR log. Here, a plurality of core samples are extracted from the formation and analyzed for one or more of the core sample attributes. The results can be plotted as the core sample attribute as a function of length along the wellbore. Then, trendlines or other modeling algorithms can be used to estimate the formation properties (or a range of formation properties) between the core sample attribute data points. The resultant plot is an artificial NMR log. Since many of the core sample attributes described herein are not measureable by conventional NMR logging techniques, these artificial NMR logs can provide additional valuable information to engineers as drilling, enhanced oil recovery, and production strategies are developed.

Any number of core samples (e.g., 2 to 100 core samples) can be used to produce artificial NMR logs. Typically, when core samples are taken, a single trip downhole can yield 10 to 20 sidewall core samples and/or 1 to 5 vertical core samples. Generally, 6 to 10 core samples per 2,000 ft of wellbore is suitable for producing artificial NMR logs. Although more or less core samples could also be used.

EXEMPLARY EMBODIMENTS

A first nonlimiting exemplary embodiment is a method comprising: saturating a core sample with a NMR saturation fluid, wherein the core sample has a permeability of 100 mD or less, to achieve a saturated core sample; taking a NMR measurement of fluids in the saturated core sample; determining a porosity of the core sample based on a correlation between the NMR measurement and a NMR signal to fluid volume calibration. Such a method may include one or more of the following: Element 1: wherein the NMR measurement is $^1$H spectroscopy measured with high-field NMR and the correlation is between an area under a $^1$H spectrum from 10 ppm to 0 ppm and the NMR signal to fluid volume calibration.; Element 2: wherein the NMR measurement is $^1$H $T_1/T_2$ ratio measured with low-field and/or intermediate-field NMR and the correlation is between an area under a $^1$H $T_1/T_2$ ratio of $1<{}^1$H $T_1/T_2$ ratio$\leq 100$ and the NMR signal to fluid volume calibration; Element 3: wherein the NMR measurement is $T_2$ NMR signal intensity as a function of refocusing delay and the correlation is between a y-value at a y-intercept of an extrapolation of the $T_2$ NMR signal intensity including x=0 and the NMR signal to fluid volume calibration; Element 4: wherein the NMR measurement is $^1$H $T_2$ relaxation times measured with low-field and/or intermediate-field NMR and the correlation is between an area under a $^1$H $T_2$ relaxation time spectrum from 0.1 ms to 300 ms and the NMR signal to fluid volume calibration; Element 5: wherein the NMR measurement is $^1$H $T_1$-$T_2$ 2-dimensional correlation map measured with low-field and/or intermediate-field NMR and the correlation is between an area under a $^1$H $T_1$-$T_2$ relaxation time plot from $T_2$ of 0.1 ms to 300 ms and $T_1$ of 0.1 ms to 300 ms and the NMR signal to fluid volume calibration; Element 6: wherein the NMR measurement is imaging measured with intermediate-field and/or high-field NMR and the correlation is between a $T_2$- and $T_1$-relaxation corrected signal for the fluids within spatial boundaries of the core sample and the NMR signal to fluid volume calibration; Element 7: wherein the NMR saturation fluid is hydrophilic; Element 8: wherein the NMR saturation fluid is hydrophobic; Element 9: wherein the NMR saturation fluid comprises dodecane; Element 10: wherein the NMR saturation fluid comprises a mixture of synthetic paraffins; Element 11: the method further comprising: taking a mass of the core sample before and after saturating; Element 12: the method further comprising: deriving a core sample property based on at least the porosity and the NMR measurement, wherein the core sample property is one or more selected from the group consisting of: a pore type distribution, a nanopore oil volume, a nanopore water volume, a micropore oil volume, a micropore water volume, a macropore oil volume, and a macropore water volume.; Element 13: Element 12 and the method further comprising: performing the method for a plurality of core samples; corresponding the core sample properties to the lengths along a wellbore from which the corresponding core samples were taken; and estimating a formation property corresponding to the core sample property at lengths along the wellbore between where the plurality of core samples were taken; Element 14: wherein the NMR measurement is a first NMR measurement; and the method further comprising: hydraulically exchanging a fluid in the core sample with a NMR exchange fluid; taking a second NMR measurement of the core sample after hydraulic exchange; and deriving a core sample property based on at least the porosity and a comparison between the first NMR measurement and the second NMR measurement, wherein the core sample property is one or more selected from the group consisting of: a recoverable oil volume, a recoverable water volume, an irreducible hydrocarbon volume, an irreducible water volume, and an immobile fluid volume; Element 15: Element 14 and the method further comprising: taking a mass of the core sample before and after hydraulic exchange; Element 16: Element 14 (and optionally Element 15) and the method further comprising: performing the method for a plurality of core samples; corresponding the core sample properties to the lengths along a wellbore from which the corresponding core samples were taken; and estimating a formation property corresponding to the core sample property at lengths along the wellbore between where the plurality of core samples were taken; Element 17: the method further comprising: providing a NMR log having porosity data of a wellbore from which the core sample was extracted; and calibrating the porosity data of the NMR log based on a comparison of the porosity data at a corresponding length along the wellbore to the porosity of the core sample; and Element 18: the method further comprising: performing the method for a plurality of core samples; corresponding the porosities to the lengths along a wellbore from which the corresponding core samples were taken; and estimating a formation porosity at lengths along the wellbore between where the plurality of core samples were taken to produce an artificial NMR log. Examples of combinations of elements can include, but are not limited to, two or more of Elements 1-6 in combination; Element 7 or Element 8 (and optionally Element 9 and/or Element 10) in combination with one or more of Elements 1-6; Element 7 or Element 8 (and optionally Element 9 and/or Element 10) in combination with one or more of Elements 11-18 and optionally in further combination with one or more of Elements 1-6; one or more of Elements 1-6 in combination with one or more of Elements 11-18; two or more of Elements 11-18 in combination; and Element 8 in combination with one or both of Elements 9-10.

A second nonlimiting exemplary embodiment of the present disclosure is a method comprising: determining a porosity of a core sample, wherein the core sample has a permeability of 100 mD or less; saturating the core sample with a NMR saturation fluid to achieve a saturated core sample; taking a NMR measurement of fluids in the saturated core sample; and deriving a volume for a pore type based on the porosity based on a correlation between the NMR measurement and a NMR signal to fluid volume calibration, wherein the pore type is selected from the group consisting of a nanopore, a micropore, a macropore, and any combination thereof. Optionally, determining the porosity of the core sample can be via the first nonlimiting example embodiment and optionally one or more of Elements 1-18. The second nonlimiting example embodiment (optionally including the first nonlimiting example embodiment) may include one or more of the following: Element 7, Element 8, Element 9, Element 10, Element 11; Element 19: wherein the NMR measurement is $^1$H $T_1/T_2$ ratio measured with low-field and/or intermediate-field NMR and the correlation is between the NMR signal to fluid volume calibration and the $^1$H $T_1/T_2$ ratio for one selected from the group consisting of $10 \leq {}^1$H $T_1/T_2 < 100$ for the nanopores, $3 \leq {}^1$H $T_1/T_2 < 10$ for the micropores, $1 \leq {}^1$H $T_1/T_2 < 3$ for the macropores, and any combination thereof; Element 20: wherein the NMR measurement is $T_2$ NMR signal intensity as a function of refocusing delay and the correlation is between the NMR signal to fluid volume calibration and a multi-exponential fit of the $T_2$ NMR signal intensity as a function of refocusing delay where a slope of each exponential factor in the multi-exponential fit relates to the pore type and a pre-exponential factor of each exponential factor in the multi-exponential fit relates to the volume of the pore type; Element 21: wherein the NMR measurement is $^1$H $T_2$ relaxation times measured with low-field and/or intermediate-field NMR and the correlation is between the NMR signal to fluid volume calibration and an area under a $^1$H $T_2$ relaxation time spectrum for one selected from the group consisting of 0.1 ms$\leq T_2 < 1.5$ ms for the nanopores, 1.5 ms≤$T_2$<30 ms for the micropores, 30 ms≤$T_2$<300 ms for the macropores, and any combination thereof; Element 22: wherein the NMR measurement is $^1$H $T_1$-$T_2$ 2-dimensional correlation map measured with low-field and/or intermediate-field NMR and the correlation is between the NMR signal to fluid volume calibration and an area under the $^1$H $T_1$-$T_2$ 2-dimensional correlation map for one selected from the group consisting of 0.1 ms≤$T_2$<1.5 ms for the nanopores, 1.5 ms≤$T_2$<30 ms for the micropores, 30 ms≤$T_2$<300 ms for the macropores, and any combination thereof; Element 23: wherein the NMR measurement is diffusometry and the correlation is between the NMR signal to fluid volume calibration and a $T_2$- and $T_1$-relaxation corrected area under a diffusion spectrum for $1 \times 10^{-14}$ m$^2$/s<diffusion rate≤$1 \times 10^{-11}$ m$^2$/s for nanopores and/or for $1 \times 10^{-11}$ m$^2$/s<diffusion rate≤$1 \times 10^{-9}$ m$^2$/s for micropores; Element 24: wherein the NMR measurement is $T_2$-weighted imaging and the correlation is between the NMR signal to fluid volume calibration and a $T_2$- and $T_1$-relaxation corrected signal for the fluids within spatial boundaries of the core sample where the $T_2$-weight is 0.1 ms≤$T_2$<1.5 ms for the nanopores, where the $T_2$-weight is 1.5 ms≤$T_2$<30 ms for the micropores, and where the $T_2$-weight is for 30 ms≤$T_2$<300 ms for the macropores; and Element 25: the method further comprising: performing the method for a plurality of core samples; corresponding the pore type to the lengths along a wellbore from which the corresponding core samples were taken; and estimating a formation pore type at lengths along the wellbore between where the plurality of core samples were taken to produce an artificial NMR log. Examples of combinations of elements include, but are not limited to, two or more of Elements 7-11 in combination; two or more of Elements 19-24 in combination; Element 25 in combination with one or more of Elements 19-24 and optionally in further combination with one or more of Elements 7-11; Element 25 in combination with one or more of Elements 7-11; and one or more of Elements 19-24 in combination with one or more of Elements 7-11.

A third nonlimiting exemplary embodiment of the present disclosure is a method comprising: determining a porosity of a core sample, wherein the core sample has a permeability of 100 mD or less; saturating the core sample with a NMR measurement saturation fluid to achieve a saturated core sample; taking a first NMR measurement of fluids in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluids in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. Optionally, determining the porosity of the core sample can be via the first nonlimiting example embodiment and optionally one or more of Elements 1-18. The third nonlimiting example embodiment (optionally including the first nonlimiting example embodiment) may include one or more of the following: Element 7, Element 8, Element 9, Element 10, Element 11; Element 26: wherein the NMR measurement is a $^1$H $T_1/T_2$ ratio measured with low-field and/or intermediate-field NMR and the comparison is a change in the $^1$H $T_1/T_2$ ratio for one selected from the group consisting of 10≤$^1$H $T_1/T_2$<100 for the nanopore volumes, 3≤$^1$H $T_1/T_2$<10 for the micropore volumes, 1≤$^1$H $T_1/T_2$<3 for the macropore volumes, and any combination thereof; Element 27: method of claim B13, wherein the NMR measurement is $T_2$ NMR signal intensity as a function of refocusing delay and the comparison a change in a multi-exponential fit of the $T_2$ NMR signal intensity as a function of refocusing delay where a slope of each exponential factor in the multi-exponential fit relates to a pore type and a pre-exponential factor of each exponential factor in the multi-exponential fit relates to a volume of the pore type; Element 28: wherein the NMR measurement is $^1$H $T_2$ relaxation times measured with low-field and/or intermediate-field NMR and the comparison is a change in an area under a $^1$H $T_2$ relaxation time spectrum for one selected from the group consisting of 0.1 ms≤$T_2$<1.5 ms for the nanopore volumes, 1.5 ms≤$T_2$<30 ms for the micropore volumes, 30 ms≤$T_2$<300 ms for the macropore volumes, and any combination thereof; Element 29: wherein the NMR measurement is $^1$H $T_1$-$T_2$ 2-dimensional correlation map measured with low-field and/or intermediate-field NMR and the comparison a change in an area under the $^1$H $T_1$-$T_2$ 2-dimensional correlation map for one selected from the group consisting of 0.1 ms≤$T_2$<1.5 ms for the nanopore volumes, 1.5 ms≤$T_2$<30 ms for the micropore volumes, 30 ms≤$T_2$<300 ms for the macropore volumes, and any combination thereof; Element 30: wherein the NMR measurement is diffusometry and the comparison is a change in a $T_2$- and $T_1$-relaxation corrected area under a diffusion spectrum for $1 \times 10^{-14}$ m$^2$/s<diffusion rate≤$1 \times 10^{-11}$ m$^2$/s for nanopore volumes and/or for $1 \times 10^{-11}$ m$^2$/s<diffusion rate≤$1 \times 10^{-9}$ m$^2$/s for micropore volumes; Element 31: wherein the NMR measurement is $T_2$-weighted imaging and the comparison is for a change in a $T_2$- and $T_1$-relaxation corrected signal for the fluids within spatial boundaries of the core sample where the $T_2$-weight is 0.1 ms≤$T_2$<1.5 ms for the nanopore volumes, where the $T_2$-weight is 1.5 ms≤$T_2$<30 ms for the micropore volumes, and where the $T_2$-weight is for 30 ms≤$T_2$<300 ms for the macropore volumes; Element 32: wherein the hydrophilic NMR exchange fluid comprises water; Element 33: wherein the hydrophobic NMR exchange fluid comprises a mixture of synthetic paraffins; Element 34: wherein the hydrophobic NMR exchange fluid comprises dodecane; Element 35: the method further comprising: taking a mass of the core sample before and after hydraulic exchange; Element 36: the method further comprising: performing compositional analysis on fluids that elutes from the core sample during hydraulic exchange; Element 37: wherein the hydrophobic NMR exchange fluid is hydraulically exchanged for the hydrophilic fluid in the core sample; Element 38: Element 37 and the method further comprising: hydraulically exchanging the hydrophilic fluid in the core sample and the hydrophobic NMR exchange fluid; taking a third NMR measurement of the fluids in the core sample after the second hydraulic exchange; and deriving a second property of the core sample based on the porosity and a comparison between the second NMR measurement and the third NMR measurement, wherein the property of the core sample is selected from the group consisting of the recoverable nanopore water volume, the recoverable micropore water volume, the recoverable macropore water volume, the irreducible nanopore water volume, the irreducible micropore water volume, the irreducible macropore water volume, an immobile nanopore volume, an immobile micropore volume, an immobile macropore volume, and any combination thereof; Element 39: wherein the hydrophilic NMR exchange fluid is hydraulically exchanged for the hydrophobic fluid in the core sample; Element 40: Element 39 and the method further comprising: hydraulically exchanging the hydrophobic fluid in the core sample and the hydrophilic NMR exchange fluid; taking a third NMR measurement of the fluids in the core sample after the second hydraulic exchange; and deriving a second property of the core sample based on the porosity and a comparison between the second NMR measurement and the third NMR measurement, wherein the property of the core sample is selected from the first group consisting of the recoverable nanopore oil volume, the recoverable micropore oil volume, the recoverable macropore oil volume, the irreducible nanopore hydrocarbon volume, the irreducible micropore hydrocarbon volume, the irreducible macropore hydrocarbon volume, an immobile nanopore volume, an immobile micropore volume, an immobile macropore volume, and any combination thereof; and Element 41: the method further comprising: performing the method for a plurality of core samples; corresponding the pore type to the lengths along a wellbore from which the corresponding core samples were taken; and estimating the first property and optionally the second property at lengths along the wellbore between where the plurality of core samples were taken to produce an artificial NMR log. Examples of combinations can include, but are not limited to, two or more of Elements 26-31 in combination; one or more of Elements 26-31 in combination with one or more of Elements 32-41; one or more of Elements 32-34 (optionally in combination with one or more of Elements 35, 36, and 41) in combination with Element 37 (and optionally Element 38) or with Element 39 (and optionally Element 40); one of Elements; one or more of Elements 35, 36, and 41 in combination with one or more of Elements 32-34; and one or more of Elements 35, 36, and 41 in combination with Element 37 (and optionally Element 38) or with Element 39 (and optionally Element 40); and one or more of Elements 7-11 in combination with one or more of Elements 26-41.

A fourth nonlimiting exemplary embodiment is a method comprising: determining a porosity of a core sample, wherein the core sample has a permeability of 100 mD or less; saturating the core sample with a NMR saturation fluid; taking a first NMR measurement of fluids in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluids in the core sample after hydraulic exchange; and deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid. Optionally, determining the porosity of the core sample can be via the first nonlimiting example embodiment and optionally one or more of Elements 1-18. The fourth nonlimiting example embodiment (optionally including the first nonlimiting example embodiment) may include one or more of the following: Element 7; Element 8; Element 9; Element 10; Element 11; Element 32; Element 33; Element 34; Element 35; Element 36; Element 42: wherein the NMR measurements are $^1$H spectroscopy measured with high-field NMR and the comparison is a change in an area under a $^1$H spectrum from 10 ppm to 0 ppm; Element 43: wherein the NMR measurements are $^1$H $T_1/T_2$ ratio measured with low-field and/or intermediate-field NMR and the comparison is a change in an area an area under a $^1$H $T_1/T_2$ ratio of $1<^1$H $T_1/T_2$ ratio$\leq 100$; Element 44: wherein the NMR measurements are $T_2$ NMR signal intensity as a function of refocusing delay and the comparison is in a y-value at a y-intercept of an extrapolation of the $T_2$ NMR signal intensity including x=0; Element 45: wherein the NMR measurements are $^1$H $T_2$ relaxation times measured with low-field and/or intermediate-field NMR and the comparison is a change in an area under a $^1$H $T_2$ relaxation time spectrum from 0.1 ms to 300 ms; Element 46: wherein the NMR measurements are $^1$H $T_1$-$T_2$ 2-dimensional correlation map measured with low-field and/or intermediate-field NMR and the comparison is a change in an area under a $^1$H $T_1$-$T_2$ relaxation time plot from $T_2$ of 0.1 ms to 300 ms and $T_1$ of 0.1 ms to 300 ms; Element 47: wherein the NMR measurements are imaging measured with intermediate-field and/or high-field NMR the comparison is a change in a $T_2$- and $T_1$-relaxation corrected signal for a fluid within spatial boundaries of the core sample; Element 48: wherein the hydrophobic NMR exchange fluid is hydraulically exchanged for the hydrophilic fluid in the core sample; Element 49: Element 48 and the method further comprising: hydraulically exchanging the hydrophilic fluid in the core sample and the hydrophobic NMR exchange fluid; taking a third NMR measurement of the fluids in the core sample after the second hydraulic exchange; and deriving a second property of the core sample based on the porosity and a comparison between the second NMR measurement and the third NMR measurement, wherein the property of the core sample is selected from the group consisting of a recoverable water volume, an irreducible water volume, an immobile volume, and any combination thereof; Element 50: wherein the hydrophilic NMR exchange fluid is hydraulically exchanged for the hydrophobic fluid in the core sample; and Element 51: Element 50 and the method further comprising: hydraulically exchanging the hydrophobic fluid in the core sample and the hydrophilic NMR exchange fluid; taking a third NMR measurement of the fluids in the core sample after the second hydraulic exchange; and deriving a second property of the core sample based on the porosity and a comparison between the second NMR measurement and the third NMR measurement, wherein the property of the core sample is selected from the group consisting of a recoverable oil volume, an irreducible hydrocarbon volume, an immobile volume, and any combination thereof; and Element 52: performing the method for a plurality of core samples; corresponding the pore type to the lengths along a wellbore from which the corresponding core samples were taken; and estimating a formation pore type at lengths along the wellbore between where the plurality of core samples were taken to produce an artificial NMR log. Examples of combinations can include, but are not limited to, two or more of Elements 42-27 in combination; one or more of Elements 42-47 in combination with one or more of Elements 32-36; one or more of Elements 42-47 (optionally in combination with one or more of Elements 32-36) in combination with Element 48 (and optionally Element 49) or with Element 50 (and optionally Element 51); one or more of Elements 35, 36, and 52 in combination with one or more of Elements 32-34; one or more of Elements 32, 33, 34, 35, 36, and 52 in combination with Element 48 (and optionally Element 49) or with Element 50 (and optionally Element 51); and one or more of Elements 7-11 in combination with one or more of Elements 42-52.

Embodiment A1 is a method comprising: saturating a core sample with a NMR saturation fluid, wherein the core sample has a permeability of mD or less, to achieve a saturated core sample; taking a NMR measurement of the saturated core sample; and determining a porosity of the core sample based on a correlation between the NMR measurement and a NMR signal to fluid volume calibration. Embodiment A2 is the method of Embodiment A1, wherein the NMR measurement is $^1H$ spectroscopy measured with high-field NMR and the correlation is between an area under a $^1H$ spectrum of a fluid in the core sample from 10 ppm to 0 ppm and the NMR signal to fluid volume calibration. Embodiment A3 is the method of Embodiment A1, wherein the NMR measurement is $^1H$ $T_1/T_2$ ratio measured with low-field and/or intermediate-field NMR and the correlation is between an area under a $^1H$ $T_1/T_2$ ratio of $1<{^1H}$ $T_1/T_2$ ratio$\leq 100$ of a fluid in the core sample and the NMR signal to fluid volume calibration. Embodiment A4 is the method of Embodiment A1, wherein the NMR measurement is $T_2$ NMR signal intensity as a function of refocusing delay and the correlation is between a y-value at a y-intercept of an extrapolation of the $T_2$ NMR signal intensity including x=0 and the NMR signal to fluid volume calibration. Embodiment A5 is the method of Embodiment A1, wherein the NMR measurement is $^1H$ $T_2$ relaxation times measured with low-field and/or intermediate-field NMR and the correlation is between an area under a $^1H$ $T_2$ relaxation time spectrum of the core sample from 0.1 ms to 300 ms and the NMR signal to fluid volume calibration. Embodiment A6 is the method of Embodiment A1, wherein the NMR measurement is $^1H$ $T_1$-$T_2$ 2-dimensional correlation map measured with low-field and/or intermediate-field NMR and the correlation is between an area under a $^1H$ $T_1$-$T_2$ relaxation time plot of fluid in the core sample from $T_2$ of 0.1 ms to 300 ms and $T_1$ of 0.1 ms to 300 ms and the NMR signal to fluid volume calibration. Embodiment A7 is the method of Embodiment A1, wherein the NMR measurement is imaging measured with intermediate-field and/or high-field NMR and the correlation is between a $T_2$- and $T_1$-relaxation corrected signal for a fluid within spatial boundaries of the core sample and the NMR signal to fluid volume calibration. Embodiment A8 is the method of any preceding Embodiment A #, wherein the NMR saturation fluid comprises dodecane. Embodiment A9 is the method of any preceding Embodiment A #, wherein the NMR saturation fluid comprises a mixture of synthetic paraffins. Embodiment A10 is the method of any preceding Embodiment A #, wherein the NMR saturation fluid is hydrophobic. Embodiment A11 is the method of any one of Embodiment A1-A9, wherein the NMR saturation fluid is hydrophilic. Embodiment A12 is the method of any preceding Embodiment A # further comprising: taking a mass of the core sample before and after hydraulic exchange. Embodiment A13 is the method of any preceding Embodiment A # further comprising: deriving a core sample property based on at least the porosity and the NMR measurement, wherein the core sample property is one or more selected from the group consisting of: a pore type distribution, a nanopore oil volume, a nanopore water volume, a micropore oil volume, a micropore water volume, a macropore oil volume, and a macropore water volume. Embodiment A14 is the method of Embodiment A13 further comprising: performing the method for a plurality of core samples; corresponding the core sample properties to the lengths along a wellbore from which the corresponding core samples were taken; and estimating a formation property corresponding to the core sample property at lengths along the wellbore between where the plurality of core samples were taken. Embodiment A15 is the method of any preceding Embodiment A # further comprising: wherein the NMR measurement is a first NMR measurement; hydraulically exchanging a fluid in the core sample with a NMR exchange fluid; taking a second NMR measurement of the core sample after hydraulic exchange; and deriving a core sample property based on at least the porosity and a comparison between the first NMR measurement and the second NMR measurement, wherein the core sample property is one or more selected from the group consisting of: a recoverable oil volume, a recoverable water volume, an irreducible hydrocarbon volume, an irreducible water volume, and an immobile fluid volume. Embodiment A16 is the method of claim Embodiment A15 further comprising: performing the method for a plurality of core samples; corresponding the core sample properties to the lengths along a wellbore from which the corresponding core samples were taken; and estimating a formation property corresponding to the core sample property at lengths along the wellbore between where the plurality of core samples were taken. Embodiment A17 is the method of one of Embodiment A1-A16 further comprising: providing an NMR log having porosity data of a wellbore from which the core sample was extracted; and calibrating the porosity data of the NMR log based on a comparison of the porosity data at a corresponding length along the wellbore to the porosity of the core sample. Embodiment A18 is the method of one of Embodiment A1-A16 further comprising: performing the method for a plurality of core samples; corresponding the porosities to the lengths along a wellbore from which the corresponding core samples were taken; and estimating a formation porosity at lengths along the wellbore between where the plurality of core samples were taken to produce an artificial NMR log.

Embodiment B1 is a method comprising: determining a porosity of a core sample, wherein the core sample has a permeability of 100 mD or less; saturating the core sample with a NMR saturation fluid to achieve a saturated core sample; taking a NMR measurement of fluids in the saturated core sample; deriving a volume for a pore type based on the porosity based on a correlation between the NMR measurement and a NMR signal to fluid volume calibration, wherein the pore type is selected from the group consisting of a nanopore, a micropore, a macropore, and any combination thereof. Embodiment B2 is the method of Embodiment B1, wherein the NMR measurement is $^1H$ $T_1/T_2$ ratio measured with low-field and/or intermediate-field NMR and the correlation is between the NMR signal to fluid volume calibration and the $^1H$ $T_1/T_2$ ratio for one selected from the group consisting of $10\leq{^1H}$ $T_1/T_2<100$ for the nanopores, $3\leq{^1H}$ $T_1/T_2<10$ for the micropores, $1\leq{^1H}$ $T_1/T_2<3$ for the macropores, and any combination thereof. Embodiment B3 is the method of Embodiment B1, wherein the NMR measurement is $T_2$ NMR signal intensity as a function of refocusing delay and the correlation is between the NMR signal to fluid volume calibration and a multi-exponential fit of the $T_2$ NMR signal intensity as a function of refocusing delay where a slope of each exponential factor in the multi-exponential fit relates to the pore type and a pre-exponential factor of each exponential factor in the multi-exponential fit relates to the volume of the pore type. Embodiment B4 is the method of Embodiment B1, wherein the NMR measurement is $^1$H $T_2$ relaxation times measured with low-field and/or intermediate-field NMR and the correlation is between the NMR signal to fluid volume calibration and an area under a $^1$H $T_2$ relaxation time spectrum for one selected from the group consisting of 0.1 ms≤$T_2$<1.5 ms for the nanopores, 1.5 ms≤$T_2$<30 ms for the micropores, 30 ms≤$T_2$<300 ms for the macropores, and any combination thereof. Embodiment B5 is the method of Embodiment B1, wherein the NMR measurement is $^1$H $T_1$-$T_2$ 2-dimensional correlation map measured with low-field and/or intermediate-field NMR and the correlation is between the NMR signal to fluid volume calibration and an area under the $^1$H $T_1$-$T_2$ 2-dimensional correlation map for one selected from the group consisting of 0.1 ms≤$T_2$<1.5 ms for the nanopores, 1.5 ms≤$T_2$<30 ms for the micropores, 30 ms≤$T_2$<300 ms for the macropores, and any combination thereof. Embodiment B6 is the method of Embodiment B1, wherein the NMR measurement is diffusometry and the correlation is between the NMR signal to fluid volume calibration and a $T_2$- and $T_1$-relaxation corrected area under a diffusion spectrum of the fluids in the core sample for $1 \times 10^{-14}$ m$^2$/s<diffusion rate≤$1 \times 10^{-11}$ m$^2$/s for nanopores and/or for $1 \times 10^{-11}$ m$^2$/s<diffusion rate≤$1 \times 10^{-9}$ m$^2$/s for micropores. Embodiment B7 is the method of Embodiment B1, wherein the NMR measurement is $T_2$-weighted imaging and the correlation is between the NMR signal to fluid volume calibration and a $T_2$- and $T_1$-relaxation corrected signal for the fluids within spatial boundaries of the core sample where the $T_2$-weight is 0.1 ms≤$T_2$<1.5 ms for the nanopores, where the $T_2$-weight is 1.5 ms≤$T_2$<30 ms for the micropores, and where the $T_2$-weight is for 30 ms≤$T_2$<300 ms for the macropores. Embodiment B8 is the method of any preceding Embodiments B # further comprising: performing the method for a plurality of core samples; corresponding the pore type to the lengths along a wellbore from which the corresponding core samples were taken; and estimating a formation pore type at lengths along the wellbore between where the plurality of core samples were taken to produce an artificial NMR log. Embodiment B9 is the method of any preceding Embodiments B #, wherein the NMR saturation fluid comprises dodecane. Embodiment B10 is the method of any preceding Embodiments B #, wherein the NMR saturation fluid comprises a mixture of synthetic paraffins. Embodiment B11 is the method of any preceding Embodiments B #, wherein the NMR saturation fluid is hydrophobic. Embodiment B12 is the method of any one of Embodiments B1-B8, wherein the NMR saturation fluid is hydrophilic. Embodiment B13 is a method comprising: determining a porosity of a core sample, wherein the core sample has a permeability of 100 milliDarcy (mD) or less; saturating the core sample with a NMR saturation fluid to achieve a saturated core sample; taking a first NMR measurement of the fluid in the saturated core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity and a comparison between the first NMR measurement and the second NMR measurement, wherein the property of the core sample is selected from the first group consisting of a recoverable nanopore oil volume, a recoverable micropore oil volume, a recoverable macropore oil volume, an irreducible nanopore hydrocarbon volume, an irreducible micropore hydrocarbon volume, an irreducible macropore hydrocarbon volume, and any combination thereof for the hydrophilic NMR exchange fluid or is selected from the second group consisting of a recoverable nanopore water volume, a recoverable micropore water volume, a recoverable macropore water volume, an irreducible nanopore water volume, an irreducible micropore water volume, an irreducible macropore water volume, and any combination thereof for the hydrophobic NMR exchange fluid. Embodiment B14 is the method of Embodiment B13, wherein the NMR measurement is a $^1$H $T_1/T_2$ ratio measured with low-field and/or intermediate-field NMR and the comparison is a change in the $^1$H $T_1/T_2$ ratio for one selected from the group consisting of 10≤$^1$H $T_1/T_2$<100 for the nanopore volumes, 3≤$^1$H $T_1/T_2$<10 for the micropore volumes, 1≤$^1$H $T_1/T_2$<3 for the macropore volumes, and any combination thereof. Embodiment B15 is the method of Embodiment B13, wherein the NMR measurement is $T_2$ NMR signal intensity as a function of refocusing delay and the comparison a change in a multi-exponential fit of the $T_2$ NMR signal intensity as a function of refocusing delay where a slope of each exponential factor in the multi-exponential fit relates to a pore type and a pre-exponential factor of each exponential factor in the multi-exponential fit relates to a volume of the pore type. Embodiment B16 is the method of Embodiment B13, wherein the NMR measurement is $^1$H $T_2$ relaxation times measured with low-field and/or intermediate-field NMR and the comparison is a change in an area under a $^1$H $T_2$ relaxation time spectrum for one selected from the group consisting of 0.1 ms≤$T_2$<1.5 ms for the nanopore volumes, 1.5 ms≤$T_2$<30 ms for the micropore volumes, 30 ms≤$T_2$<300 ms for the macropore volumes, and any combination thereof. Embodiment B17. is the method of Embodiment B13, wherein the NMR measurement is $^1$H $T_1$-$T_2$ 2-dimensional correlation map measured with low-field and/or intermediate-field NMR and the comparison a change in an area under the $^1$H $T_1$-$T_2$ 2-dimensional correlation map for one selected from the group consisting of 0.1 ms≤$T_2$<1.5 ms for the nanopore volumes, 1.5 ms≤$T_2$<30 ms for the micropore volumes, 30 ms≤$T_2$<300 ms for the macropore volumes, and any combination thereof. Embodiment B18 is the method of Embodiment B13, wherein the NMR measurement is diffusometry and the comparison is a change a $T_2$- and $T_1$-relaxation corrected area under a diffusion spectrum of the fluids in the core sample for $1 \times 10^{-14}$ m$^2$/s<diffusion rate≤$1 \times 10^{-11}$ m$^2$/s for nanopore volumes and/or for $1 \times 10^{-11}$ m$^2$/s<diffusion rate≤$1 \times 10^{-9}$ m$^2$/s for micropore volumes. Embodiment B19 is the method of Embodiment B13, wherein the NMR measurement is $T_2$-weighted imaging and the comparison is for a change in a $T_2$- and $T_1$-relaxation corrected signal for the fluids within spatial boundaries of the core sample where the $T_2$-weight is 0.1 ms≤$T_2$<1.5 ms for the nanopore volumes, where the $T_2$-weight is 1.5 ms≤$T_2$<30 ms for the micropore volumes, and where the $T_2$-weight is for 30 ms≤$T_2$<300 ms for the macropore volumes. Embodiment B20 is the method of one of Embodiments B13-B19 further comprising, wherein the hydrophobic NMR exchange fluid is hydraulically exchanged for the hydrophilic fluid in the core sample. Embodiment B21 is the method of Embodiment B20 further comprising: hydraulically exchanging the hydrophilic fluid in the core sample and the hydrophobic NMR exchange fluid; taking a third NMR measurement of the fluid in the core sample after the second hydraulic exchange; and deriving a second property of the core sample based on the porosity and a comparison between the second NMR measurement and the third NMR measurement, wherein the property of the core sample is selected from the group consisting of the recoverable nanopore water volume, the recoverable micropore water volume, the recoverable macropore water volume, the irreducible nanopore water volume, the irreducible micropore water volume, the irreducible macropore water volume, an immobile nanopore volume, an immobile micropore volume, an immobile macropore volume, and any combination thereof. Embodiment B22 is the method of one of Embodiments B13-B19 further comprising: wherein the hydrophilic NMR exchange fluid is hydraulically exchanged for the hydrophobic fluid in the core sample. Embodiment B23 is the method of Embodiment B22 further comprising: hydraulically exchanging the hydrophobic fluid in the core sample and the hydrophilic NMR exchange fluid; taking a third NMR measurement of the fluid in the core sample after the second hydraulic exchange; and deriving a second property of the core sample based on the porosity and a comparison between the second NMR measurement and the third NMR measurement, wherein the property of the core sample is selected from the first group consisting of the recoverable nanopore oil volume, the recoverable micropore oil volume, the recoverable macropore oil volume, the irreducible nanopore hydrocarbon volume, the irreducible micropore hydrocarbon volume, the irreducible macropore hydrocarbon volume, an immobile nanopore volume, an immobile micropore volume, an immobile macropore volume, and any combination thereof. Embodiment B24 is the method of one of Embodiments B13-B23 further comprising: performing the method for a plurality of core samples; corresponding the pore type to the lengths along a wellbore from which the corresponding core samples were taken; and estimating the first property and optionally the second property at lengths along the wellbore between where the plurality of core samples were taken to produce an artificial NMR log. Embodiment B25 is the method of one of Embodiments B13-B24, wherein the NMR saturation fluid comprises dodecane. Embodiment B26 is the method of one of Embodiments B13-B24, wherein the NMR saturation fluid comprises a mixture of synthetic paraffins. Embodiment B27 is the method of one of Embodiments B13-B26, wherein the NMR saturation fluid is hydrophobic. Embodiment B28 is the method of one of Embodiments B13-B24, wherein the NMR saturation fluid is hydrophilic. Embodiment B29 is the method of one of Embodiments B13-B28 further comprising: taking a mass of the core sample before and after hydraulic exchange. Embodiment B30 is the method of one of Embodiments B13-B29 further comprising: performing compositional analysis on fluids that elutes from the core sample during hydraulic exchange.

Embodiment C1. A method comprising: determining a porosity of a core sample, wherein the core sample has a permeability of 100 mD or less; saturating the core sample with an NMR saturation fluid; taking a first NMR measurement of fluid in the core sample; hydraulically exchanging a hydrophobic fluid or a hydrophilic fluid in the core sample in a hydrophilic NMR exchange fluid or a hydrophobic NMR exchange fluid, respectively; taking a second NMR measurement of the fluid in the core sample after hydraulic exchange; deriving a property of the core sample based on the porosity, a NMR signal to fluid volume calibration, and a comparison between the first NMR measurement and the second NMR measurement, wherein the property of the core sample is selected from the first group consisting of a recoverable oil volume, an irreducible hydrocarbon volume, and any combination thereof when using the hydrophilic NMR exchange fluid or is selected from the second group consisting of a recoverable water volume, an irreducible water volume, and any combination thereof when using the hydrophobic NMR exchange fluid. Embodiment C2 is the method of Embodiment C1, wherein the NMR measurement is $^1H$ spectroscopy measured with high-field NMR and the comparison is a change in an area under a $^1H$ spectrum of a fluid in the core sample from 10 ppm to 0 ppm. Embodiment C3 is the method of Embodiment C1, wherein the NMR measurement is $^1H$ $T_1/T_2$ ratio measured with low-field and/or intermediate-field NMR and the comparison is a change in an area an area under a $^1H$ $T_1/T_2$ ratio of $1<^1H$ $T_1/T_2$ ratio$\leq 100$ of a fluid in the core sample. Embodiment C4 is the method of Embodiment C1, wherein the NMR measurement is $T_2$ NMR signal intensity as a function of refocusing delay and the comparison is in a y-value at a y-intercept of an extrapolation of the $T_2$ NMR signal intensity including x=0. Embodiment C5 is the method of Embodiment C1, wherein the NMR measurement is $^1H$ $T_2$ relaxation times measured with low-field and/or intermediate-field NMR and the comparison is a change in an area under a $^1H$ $T_2$ relaxation time spectrum of the core sample from 0.1 ms to 300 ms. Embodiment C6 is the method of Embodiment C1, wherein the NMR measurement is $^1H$ $T_1$-$T_2$ 2-dimensional correlation map measured with low-field and/or intermediate-field NMR and the comparison is a change in an area under a $^1H$ $T_1$-$T_2$ relaxation time plot of fluid in the core sample from $T_2$ of 0.1 ms to 300 ms and $T_1$ of 0.1 ms to 300 ms and the NMR signal to fluid volume calibration. Embodiment C7 is the method of Embodiment C1, wherein the NMR measurement is imaging measured with intermediate-field and/or high-field NMR the comparison is a change in a $T_2$- and $T_1$-relaxation corrected signal for a fluid within spatial boundaries of the core sample and the NMR signal to fluid volume calibration. Embodiment C8 is the method of any preceding Embodiment C #, wherein the NMR saturation fluid comprises dodecane. Embodiment C9 is the method of any preceding Embodiment C #, wherein the NMR saturation fluid comprises a mixture of synthetic paraffins. Embodiment C10 is the method of any preceding Embodiment C #, wherein the NMR saturation fluid is hydrophobic. Embodiment C11 is the method of any one of Embodiment C1-C9, wherein the NMR saturation fluid is hydrophilic. Embodiment C12 is the method of one of Embodiment C1-C11 further comprising, wherein the hydrophobic NMR exchange fluid is hydraulically exchanged for the hydrophilic fluid in the core sample. Embodiment C13 is the method of Embodiment C9 further comprising: hydraulically exchanging the hydrophilic fluid in the core sample and the hydrophobic NMR exchange fluid; taking a third NMR measurement of the fluid in the core sample after the second hydraulic exchange; and deriving a second property of the core sample based on the porosity and a comparison between the second NMR measurement and the third NMR measurement, wherein the property of the core sample is selected from the group consisting of a recoverable water volume, an irreducible water volume, an immobile volume, and any combination thereof. Embodiment C14 is the method of one of Embodiment C1-C11 further comprising: wherein the hydrophilic NMR exchange fluid is hydraulically exchanged for the hydrophobic fluid in the core sample. Embodiment C15 is the method of claim Embodiment C11 further comprising: hydraulically exchanging the hydrophobic fluid in the core sample and the hydrophilic NMR exchange fluid; taking a third NMR measurement of the fluid in the core sample after the second hydraulic exchange; and deriving a second property of the core sample based on the porosity and a comparison between the second NMR measurement and the third NMR measurement, wherein the property of the core sample is selected from the group consisting of a recoverable oil volume, an irreducible hydrocarbon volume, an immobile volume, and any combination thereof. Embodiment C16 is the method of any preceding Embodiment C # further comprising: performing the method for a plurality of core samples; corresponding the pore type to the lengths along a wellbore from which the corresponding core samples were taken; and estimating a formation pore type at lengths along the wellbore between where the plurality of core samples were taken to produce an artificial NMR log. Embodiment C17 is the method of any preceding Embodiment C # further comprising: taking a mass of the core sample before and after hydraulic exchange. Embodiment C18 is the method of any preceding Embodiment C # further comprising: performing compositional analysis on the hydrocarbon that elutes from the core sample during hydraulic exchange.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity. It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While compositions and methods are described herein in terms of "comprising" various components or steps, the compositions and methods can also "consist essentially of" or "consist of" the various components and steps.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A method comprising:
determining a porosity of a core sample, wherein the core sample has a permeability of 100 milliDarcy (mD) or less;
saturating the core sample with a nuclear magnetic resonance (NMR) saturation fluid;
taking a first NMR measurement of fluids in the core sample;
hydraulically exchanging a hydrophobic fluid or a hydrophilic fluid in the core sample in a hydrophilic NMR exchange fluid or a hydrophobic NMR exchange fluid, respectively;
taking a second NMR measurement of the fluids in the core sample after hydraulic exchange;
deriving a property of the core sample based on the porosity, a NMR signal to fluid volume calibration, and a comparison between the first NMR measurement and the second NMR measurement, wherein the property of the core sample is selected from a first group consisting of a recoverable oil volume, an irreducible hydrocarbon volume, and any combination thereof when using the hydrophilic NMR exchange fluid or is selected from a second group consisting of a recoverable water volume, an irreducible water volume, and any combination thereof when using the hydrophobic NMR exchange fluid.

2. The method of claim 1, wherein the NMR measurements are $^1$H spectroscopy measured with high-field NMR and the comparison is a change in an area under a $^1$H spectrum from 10 ppm to 0 ppm.

3. The method of claim 1, wherein the NMR measurements are $^1$H $T_1/T_2$ ratio measured with low-field and/or intermediate-field NMR and the comparison is a change in an area under a $^1$H $T_1/T_2$ ratio of $1 < ^1$H $T_1/T_2$ ratio $\leq 100$.

4. The method of claim 1, wherein the NMR measurements are $T_2$ NMR signal intensity as a function of refocusing delay and the comparison is in a y-value at a y-intercept of an extrapolation of the $T_2$ NMR signal intensity including x=0.

5. The method of claim 1, wherein the NMR measurements are $^1$H $T_2$ relaxation times measured with low-field and/or intermediate-field NMR and the comparison is a change in an area under a $^1$H $T_2$ relaxation time spectrum from 0.1 ms to 300 ms.

6. The method of claim 1, wherein the NMR measurements are $^1$H $T_1$-$T_2$ 2-dimensional correlation map measured with low-field and/or intermediate-field NMR and the comparison is a change in an area under a $^1$H $T_1$-$T_2$ relaxation time plot from $T_2$ of 0.1 ms to 300 ms and $T_1$ of 0.1 ms to 300 ms.

7. The method of claim 1, wherein the NMR measurements are imaging measured with intermediate-field and/or high-field NMR and the comparison is a change in a $T_2$- and $T_1$ relaxation corrected signal for a fluid within spatial boundaries of the core sample.

8. The method of claim 1, wherein the NMR saturation fluid is hydrophobic.

9. The method of claim 1, wherein the NMR saturation fluid comprises dodecane.

10. The method of claim 1, wherein the NMR saturation fluid comprises a mixture of synthetic paraffins.

11. The method of claim 1, wherein the NMR saturation fluid is hydrophilic.

12. The method of claim 1, wherein the hydrophobic NMR exchange fluid is hydraulically exchanged for the hydrophilic fluid in the core sample, and the method further comprises:
hydraulically exchanging the hydrophilic fluid in the core sample and the hydrophobic NMR exchange fluid;
taking a third NMR measurement of the fluids in the core sample after a second hydraulic exchange; and
deriving a second property of the core sample based on the porosity and a comparison between the second NMR measurement and the third NMR measurement, wherein the property of the core sample is selected from a group consisting of a recoverable water volume, an irreducible water volume, an immobile volume of water, and any combination thereof.

13. The method of claim 1, wherein the hydrophilic NMR exchange fluid is hydraulically exchanged for the hydrophobic fluid in the core sample, and the method further comprises:
hydraulically exchanging the hydrophobic fluid in the core sample and the hydrophilic NMR exchange fluid;
taking a third NMR measurement of the fluids in the core sample after a second hydraulic exchange; and
deriving a second property of the core sample based on the porosity and a comparison between the second NMR measurement and the third NMR measurement, wherein the property of the core sample is selected from a group consisting of a recoverable oil volume, an irreducible hydrocarbon volume, an immobile volume of water, and any combination thereof.

14. The method of claim 1 further comprising:
performing the method for a plurality of core samples;
corresponding a pore type to lengths along a wellbore from which the corresponding core samples were taken; and
estimating a formation pore type at the lengths along the wellbore between where the plurality of core samples were taken to produce an artificial NMR log.

15. The method of claim 1 further comprising:
taking a mass of the core sample before and after saturating.

16. The method of claim 1 further comprising:
taking a mass of the core sample before and after hydraulic exchange.

17. The method of claim 1 further comprising:
performing compositional analysis on fluids that elute from the core sample during hydraulic exchange.

18. The method of claim 1, wherein the hydrophobic NMR exchange fluid comprises dodecane.

19. The method of claim 1, wherein the hydrophobic NMR exchange fluid comprises a mixture of synthetic paraffins.

20. The method of claim 1, wherein the hydrophilic NMR exchange fluid comprises water.

* * * * *